(12) United States Patent
Yu et al.

(10) Patent No.: US 10,340,206 B2
(45) Date of Patent: Jul. 2, 2019

(54) DENSE REDISTRIBUTION LAYERS IN SEMICONDUCTOR PACKAGES AND METHODS OF FORMING THE SAME

(71) Applicant: Taiwan Semiconductor Manufacturing Company, Ltd., Hsin-Chu (TW)

(72) Inventors: Chen-Hua Yu, Hsin-Chu (TW); Hung-Jui Kuo, Hsin-Chu (TW); Hui-Jung Tsai, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/285,284

(22) Filed: Oct. 4, 2016

(65) Prior Publication Data
US 2018/0040546 A1    Feb. 8, 2018

Related U.S. Application Data

(60) Provisional application No. 62/371,620, filed on Aug. 5, 2016.

(51) Int. Cl.
*H01L 23/485* (2006.01)
*H01L 23/538* (2006.01)
(Continued)

(52) U.S. Cl.
CPC ...... *H01L 23/4855* (2013.01); *H01L 21/0274* (2013.01); *H01L 21/441* (2013.01);
(Continued)

(58) Field of Classification Search
CPC ..... H01L 24/05; H01L 24/13; H01L 21/0274; H01L 21/441; H01L 21/76816;
(Continued)

(56) References Cited

U.S. PATENT DOCUMENTS 6,291,891 B1 * 9/2001 Higashi ................ H01L 21/288
257/750
7,669,320 B2 * 3/2010 Hurwitz ............... H01L 21/4857
174/260

(Continued)

FOREIGN PATENT DOCUMENTS

CN 103579204 A 2/2014
CN 104658989 A 5/2015
CN 105789062 A 7/2016

*Primary Examiner* — Mark W Tornow
*Assistant Examiner* — Abbigale A Boyle
(74) *Attorney, Agent, or Firm* — Slater Matsil, LLP

(57) ABSTRACT

A method embodiment includes forming a patterned first photo resist over a seed layer. A first opening in the patterned first photo resist exposes the seed layer. The method further includes plating a first conductive material in the first opening on the seed layer, removing the patterned first photo resist, and after removing the patterned first photo resist, forming a patterned second photo resist over the first conductive material. A second opening in the patterned second photo resist exposes a portion of the first conductive material. The method further includes plating a second conductive material in the second opening on the first conductive material, removing the patterned second photo resist, and after removing the patterned second photo resist, depositing a dielectric layer around the first conductive material and the second conductive material.

20 Claims, 24 Drawing Sheets

(51) Int. Cl.
| | |
|---|---|
| *H01L 21/768* | (2006.01) |
| *H01L 21/441* | (2006.01) |
| *H01L 23/00* | (2006.01) |
| *H01L 23/522* | (2006.01) |
| *H01L 21/027* | (2006.01) |
| *H01L 23/528* | (2006.01) |
| *H01L 21/48* | (2006.01) |
| *H01L 21/56* | (2006.01) |
| *H01L 23/31* | (2006.01) |
| *H01L 23/498* | (2006.01) |
| *H01L 25/065* | (2006.01) |
| *H01L 25/10* | (2006.01) |
| *H01L 25/00* | (2006.01) |

(52) U.S. Cl.
CPC ........ *H01L 21/486* (2013.01); *H01L 21/4846* (2013.01); *H01L 21/4857* (2013.01); *H01L 21/4875* (2013.01); *H01L 21/563* (2013.01); *H01L 21/76819* (2013.01); *H01L 21/76885* (2013.01); *H01L 23/3114* (2013.01); *H01L 23/498* (2013.01); *H01L 23/49811* (2013.01); *H01L 23/49827* (2013.01); *H01L 23/5226* (2013.01); *H01L 23/5283* (2013.01); *H01L 23/5383* (2013.01); *H01L 23/5384* (2013.01); *H01L 23/5386* (2013.01); *H01L 23/5389* (2013.01); *H01L 24/05* (2013.01); *H01L 24/13* (2013.01); *H01L 24/19* (2013.01); *H01L 24/20* (2013.01); *H01L 24/97* (2013.01); *H01L 21/561* (2013.01); *H01L 21/568* (2013.01); *H01L 25/0655* (2013.01); *H01L 25/0657* (2013.01); *H01L 25/105* (2013.01); *H01L 25/50* (2013.01); *H01L 2224/0401* (2013.01); *H01L 2224/04042* (2013.01); *H01L 2224/04105* (2013.01); *H01L 2224/12105* (2013.01); *H01L 2224/16238* (2013.01); *H01L 2224/32145* (2013.01); *H01L 2224/32225* (2013.01); *H01L 2224/32245* (2013.01); *H01L 2224/48091* (2013.01); *H01L 2224/48227* (2013.01); *H01L 2224/73265* (2013.01); *H01L 2224/73267* (2013.01); *H01L 2224/81005* (2013.01); *H01L 2224/92244* (2013.01); *H01L 2224/97* (2013.01); *H01L 2225/0651* (2013.01); *H01L 2225/06568* (2013.01); *H01L 2225/1035* (2013.01); *H01L 2225/1041* (2013.01); *H01L 2225/1058* (2013.01); *H01L 2924/1531* (2013.01); *H01L 2924/15311* (2013.01); *H01L 2924/18161* (2013.01)

(58) Field of Classification Search
CPC ......... H01L 21/76819; H01L 21/76885; H01L 23/4855; H01L 23/5226; H01L 23/49816; H01L 23/5283; H01L 23/5386
See application file for complete search history.

(56) References Cited

U.S. PATENT DOCUMENTS

| | | | |
|---|---|---|---|
| 8,361,842 B2 | 1/2013 | Yu et al. | |
| 8,462,516 B2* | 6/2013 | Wong | B81C 1/00095 174/254 |
| 8,580,687 B2* | 11/2013 | Dallmann | H01L 21/76831 257/751 |
| 8,680,647 B2 | 3/2014 | Yu et al. | |
| 8,703,542 B2 | 4/2014 | Lin et al. | |
| 8,759,964 B2 | 6/2014 | Pu et al. | |
| 8,778,738 B1 | 7/2014 | Lin et al. | |
| 8,785,299 B2 | 7/2014 | Mao et al. | |
| 8,803,306 B1 | 8/2014 | Yu et al. | |
| 8,809,996 B2 | 8/2014 | Chen et al. | |
| 8,829,676 B2 | 9/2014 | Yu et al. | |
| 8,877,554 B2 | 11/2014 | Tsai et al. | |
| 2007/0026631 A1* | 2/2007 | Lin | H01L 23/3157 438/424 |
| 2007/0289127 A1 | 12/2007 | Hurwitz et al. | |
| 2010/0090352 A1* | 4/2010 | Muramatsu | H01L 23/49811 257/778 |
| 2011/0291288 A1 | 12/2011 | Wu et al. | |
| 2012/0080795 A1 | 4/2012 | Dallmann et al. | |
| 2013/0062760 A1 | 3/2013 | Hung et al. | |
| 2013/0062761 A1 | 3/2013 | Lin et al. | |
| 2013/0168848 A1 | 7/2013 | Lin et al. | |
| 2013/0264684 A1 | 10/2013 | Yu et al. | |
| 2013/0307140 A1 | 11/2013 | Huang et al. | |
| 2014/0021583 A1 | 1/2014 | Lo et al. | |
| 2014/0203429 A1 | 7/2014 | Yu et al. | |
| 2014/0225222 A1 | 8/2014 | Yu et al. | |
| 2014/0252646 A1 | 9/2014 | Hung et al. | |
| 2014/0264930 A1 | 9/2014 | Yu et al. | |
| 2015/0145142 A1 | 5/2015 | Lin et al. | |
| 2015/0364394 A1* | 12/2015 | Lin | H01L 24/03 438/127 |

* cited by examiner

DENSE REDISTRIBUTION LAYERS IN SEMICONDUCTOR PACKAGES AND METHODS OF FORMING THE SAME

PRIORITY AND CROSS-REFERENCE

This application claims the benefits of U.S. Provisional Application Ser. No. 62/371,620, filed on Aug. 5, 2016, which application is hereby incorporated herein by reference in its entirety.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged. An example of such packaging systems is Package-on-Package (PoP) technology. In a PoP device, a top semiconductor package is stacked on top of a bottom semiconductor package to provide a high level of integration and component density. PoP technology generally enables production of semiconductor devices with enhanced functionalities and small footprints on a printed circuit board (PCB).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
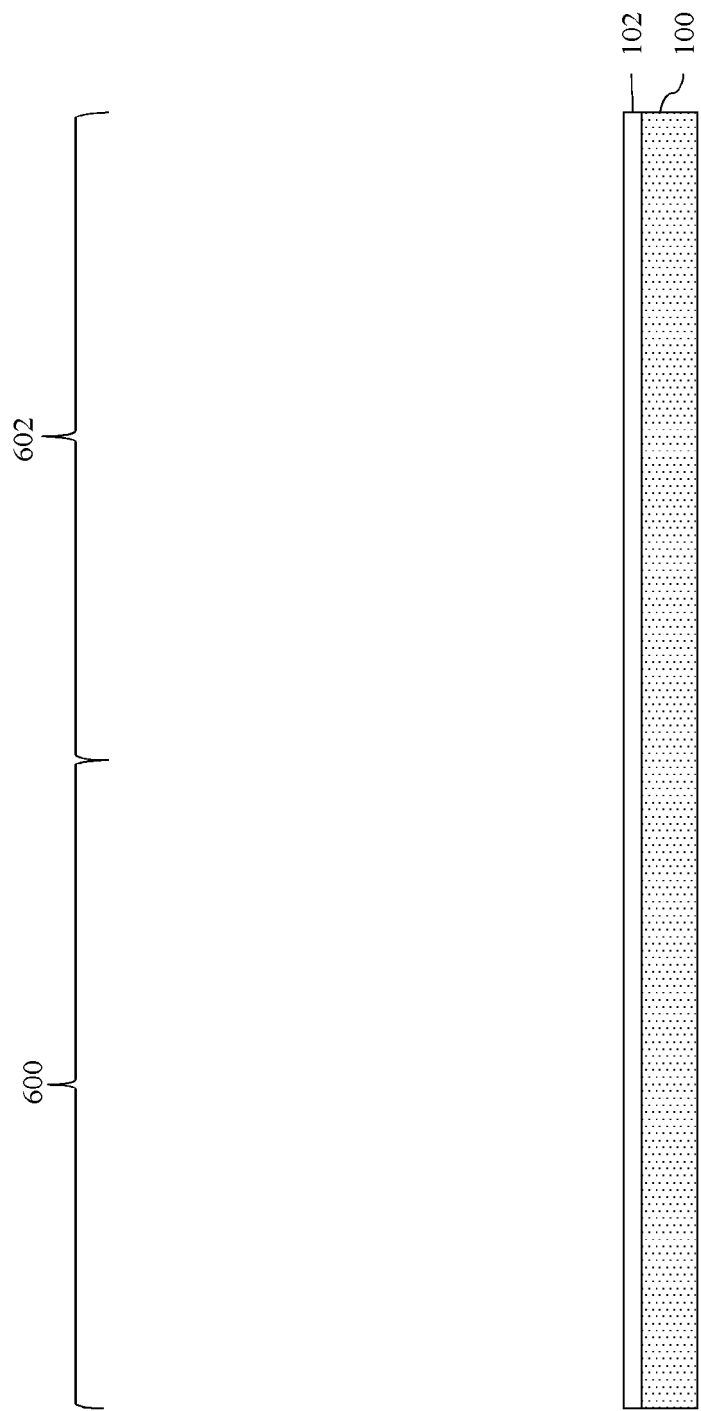
FIGS. 1 through 36 illustrate various intermediary stages of forming a semiconductor device package in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide methods of forming conductive features, such as conductive lines and/or vias, in redistribution layers (RDLs) of a semiconductor package. Although various embodiments are described with respect to a specific context (e.g., an integrated fan-out (InFO) package having fan-out RDLs), various conductive feature fabrication methods may be applied to other packages in any area of a device where conductive features are found. Various embodiments may provide one or more of the following non-limiting advantages: smaller conductive vias by using a higher resolution photoresist to define a shape of the conductive vias; lower manufacturing cost; reduced polymer layer resolution window issues; improved planarity in redistribution layers; and the like.

FIGS. 1 through 36 illustrate cross-sectional views of intermediate steps during a process for forming a first package structure in accordance with some embodiments. FIG. 1 illustrates a carrier substrate 100 and a release layer 102 formed on the carrier substrate 100. A first package region 600 and a second package region 602 for the formation of a first package and a second package, respectively, are illustrated.

The carrier substrate 100 may be a glass carrier substrate, a ceramic carrier substrate, or the like. The carrier substrate 100 may be a wafer, such that multiple packages can be formed on the carrier substrate 100 simultaneously. The release layer 102 may be formed of a polymer-based material, which may be removed along with the carrier substrate 100 from the overlying structures that will be formed in subsequent steps. In some embodiments, the release layer 102 is an epoxy-based thermal-release material, which loses its adhesive property when heated, such as a light-to-heat-conversion (LTHC) release coating. In other embodiments, the release layer 102 may be an ultra-violet (UV) glue, which loses its adhesive property when exposed to UV lights. The release layer 102 may be dispensed as a liquid and cured, may be a laminate film laminated onto the carrier substrate 100, or may be the like. The top surface of the release layer 102 may be leveled and may have a high degree of coplanarity.

Figure 2:
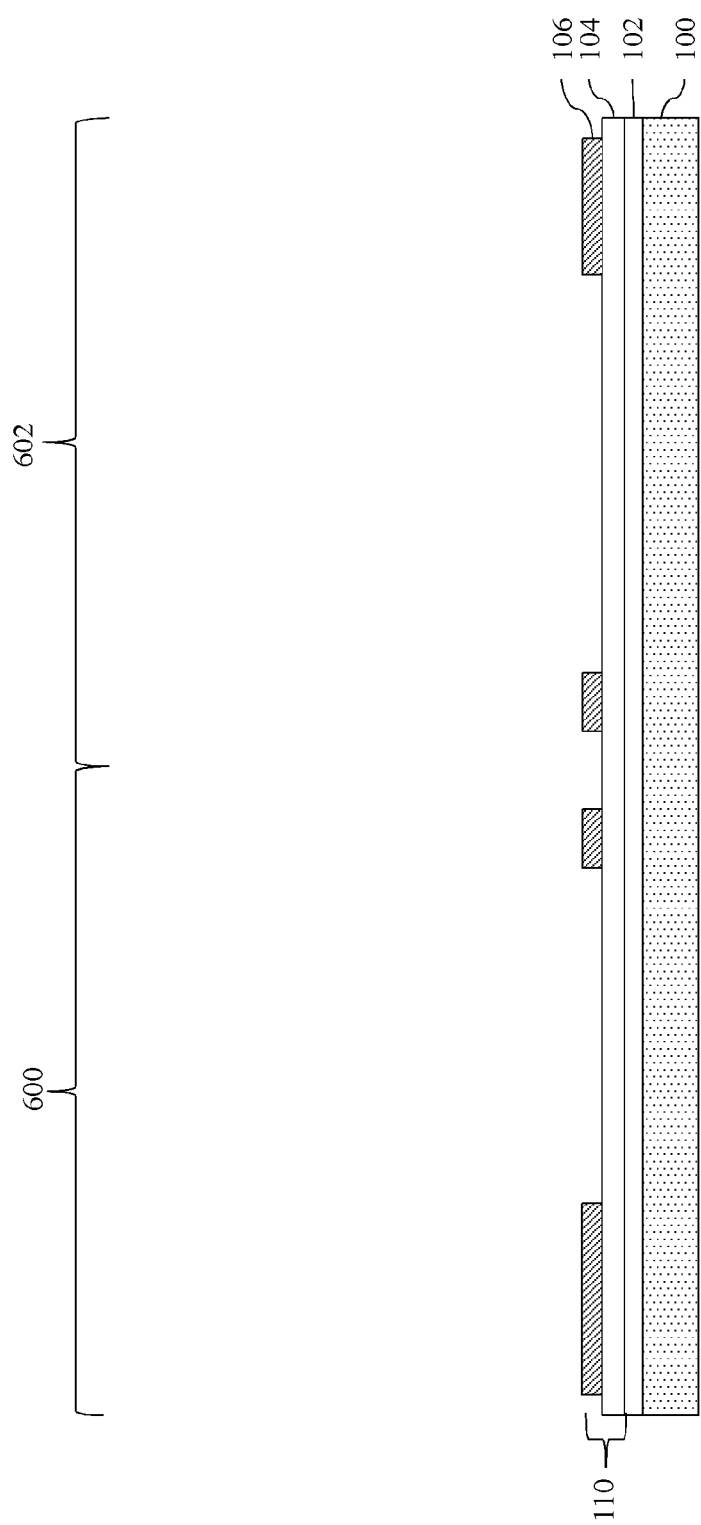

In FIG. 2, a dielectric layer 104 and a metallization pattern 106 are formed. As illustrated in FIG. 2, a dielectric layer 104 is formed on the release layer 102. The bottom surface of the dielectric layer 104 may be in contact with the top surface of the release layer 102. In some embodiments, the dielectric layer 104 is formed of a polymer, such as polybenzoxazole (PBO), polyimide, benzocyclobutene (BCB), or the like. In other embodiments, the dielectric layer 104 is formed of a nitride such as silicon nitride; an oxide such as silicon oxide, phosphosilicate glass (PSG), borosilicate glass (BSG), boron-doped phosphosilicate glass (BPSG), or the like. The dielectric layer 104 may be formed by any acceptable deposition process, such as spin coating, chemical vapor deposition (CVD), laminating, the like, or a combination thereof.

The metallization pattern 106 is formed on the dielectric layer 104. As an example to form metallization pattern 106, a seed layer (not shown) is formed over the dielectric layer 104. In some embodiments, the seed layer is a metal layer, which may be a single layer or a composite layer comprising a plurality of sub-layers formed of different materials. For example, the seed layer may comprise titanium, copper, molybdenum, tungsten, titanium nitride, titanium tungsten, combinations thereof, or the like. In some embodiments, the seed layer comprises a titanium layer and a copper layer over the titanium layer. The seed layer may be formed using, for example, PVD or the like. A photo resist is then formed and patterned on the seed layer. The photo resist may be formed by spin coating or the like and may be exposed to light for patterning. The pattern of the photo resist corresponds to the metallization pattern 106. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the metallization pattern 106.

The dielectric layer 104 and the metallization patterns 106 may be referred to as a back-side redistribution structure no. As illustrated, the back-side redistribution structure no includes the one dielectric layer 104 one metallization pattern 106. In other embodiments, the back-side redistribution structure no can include any number of dielectric layers, metallization patterns, and vias.

For example, in an embodiment, an additional dielectric layer (not shown) is optionally formed on the metallization pattern 106 and the dielectric layer 104. In some embodiments, the additional dielectric layer is formed of a polymer, which may be a photo-sensitive material such as PBO, polyimide, BCB, or the like, that may be patterned using a lithography mask. In other embodiments, the additional dielectric layer is formed of a nitride such as silicon nitride; an oxide such as silicon oxide, PSG, BSG, BPSG; or the like. The additional dielectric layer may be formed by spin coating, lamination, CVD, the like, or a combination thereof. The additional dielectric layer is then patterned to form openings to expose portions of the metallization pattern 106. The patterning may be by an acceptable process, such as by exposing the dielectric layer to light when the dielectric layer is a photo-sensitive material or by etching using, for example, an anisotropic etching. Subsequently formed conductive features may be electrically connected to the metallization pattern 106 through conductive vias formed in the openings of the additional dielectric layer.

One or more additional metallization patterns and dielectric layers may be formed in the back-side redistribution structure no by repeating the processes for forming metallization patterns 106 and the optional additional dielectric layer (not shown). Vias may be formed during the formation of a metallization pattern by forming the seed layer and conductive material of the metallization pattern in the opening of the underlying dielectric layer. Alternatively, the vias may be formed using an embodiment via formation process as described below with respect to FIGS. 9 through 32. The vias may therefore interconnect and electrically couple the various metallization patterns.

Figure 3:
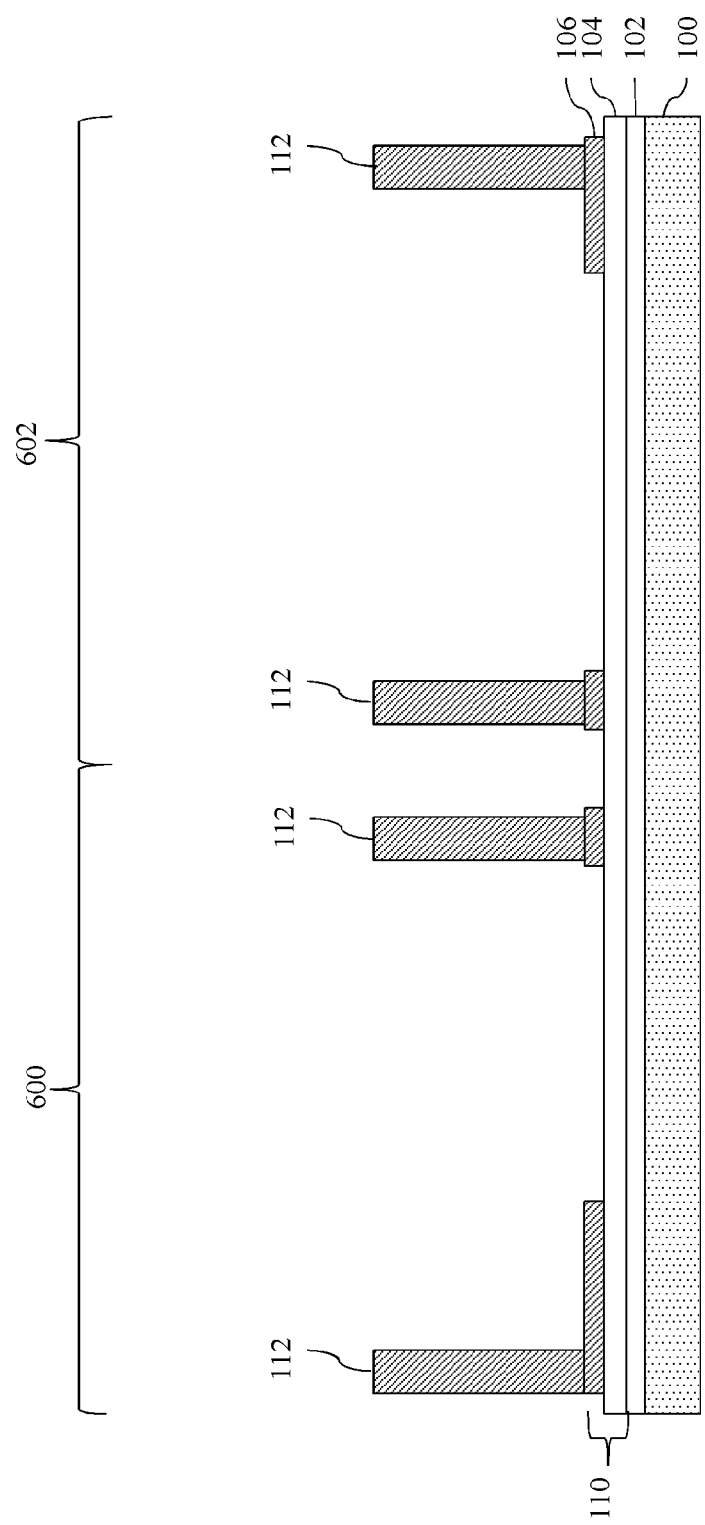

Further in FIG. 3, through vias 112 are formed. As an example to form the through vias 112, a seed layer is formed over the back-side redistribution structure 110, e.g., the dielectric layer 104 and the metallization pattern 106. In some embodiments, the seed layer is a metal layer, which may be a single layer or a composite layer comprising a plurality of sub-layers formed of different materials. For example, the seed layer may comprise titanium, copper, molybdenum, tungsten, titanium nitride, titanium tungsten, combinations thereof, or the like. In some embodiments, the seed layer comprises a titanium layer and a copper layer over the titanium layer. The seed layer may be formed using, for example, PVD or the like. A photo resist is formed and patterned on the seed layer. The photo resist may be formed by spin coating or the like and may be exposed to light for patterning. The pattern of the photo resist corresponds to the through vias 112. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. The photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form through vias 112. In other embodiments, the seed layer is omitted, and the metallization pattern 106 is used as a seed layer for forming the through vias 112.

Figure 4:
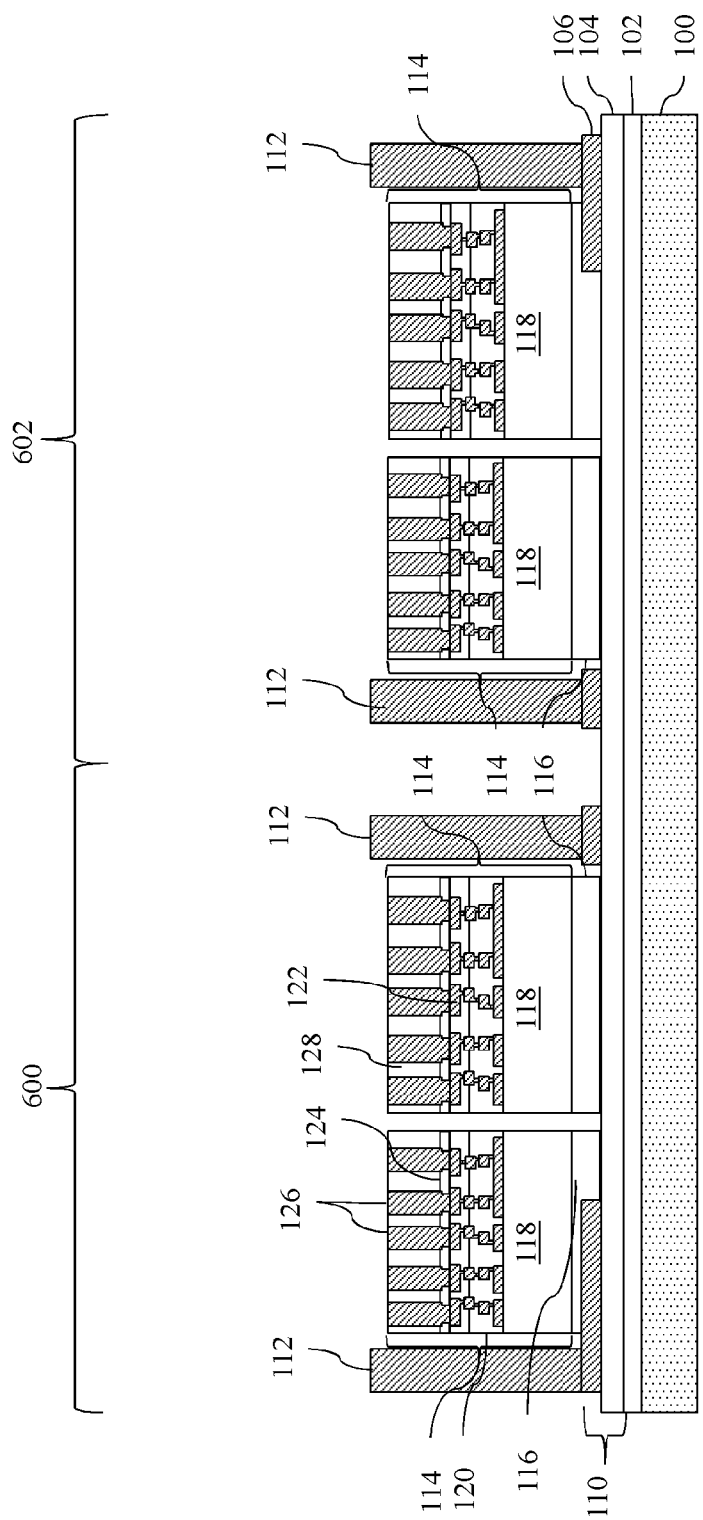

In FIG. 4, integrated circuit dies 114 are adhered to the back-side redistribution structure no by an adhesive 116. For example, the adhesive 116 may be adhered to a top surface of the metallization pattern 106, and the adhesive 116 may further extend along sidewalls of the metallization patter 106. In other embodiments, such as when an additional dielectric layer (not shown) is optionally formed over the metallization pattern 106, the adhesive 116 may be adhered to a top surface of the optional additional dielectric layer.

As illustrated in FIG. 4, two integrated circuit dies 114 are adhered in each of the first package region 600 and the second package region 602, and in other embodiments, more or less integrated circuit dies 114 may be adhered in each region. For example, in an embodiment, only one integrated circuit die 114 may be adhered in each region. The integrated circuit dies 114 may be logic dies (e.g., central processing unit, microcontroller, etc.), memory dies (e.g., dynamic random access memory (DRAM) die, static random access memory (SRAM) die, etc.), power management dies (e.g., power management integrated circuit (PMIC) die), radio frequency (RF) dies, sensor dies, micro-electro-mechanical-system (MEMS) dies, signal processing dies (e.g., digital signal processing (DSP) die), front-end dies (e.g., analog front-end (AFE) dies), the like, or a combination thereof. Also, in some embodiments, the integrated circuit dies 114 may be different sizes (e.g., different heights and/or surface areas), and in other embodiments, the integrated circuit dies 114 may be the same size (e.g., same heights and/or surface areas).

Before being adhered to the dielectric layer 108, the integrated circuit dies 114 may be processed according to applicable manufacturing processes to form integrated circuits in the integrated circuit dies 114. For example, the integrated circuit dies 114 each include a semiconductor substrate 118, such as silicon, doped or undoped, or an active layer of a semiconductor-on-insulator (SOI) substrate. The semiconductor substrate may include other semiconductor material, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. Devices, such as transistors, diodes, capacitors, resistors, etc., may be formed in and/or on the semiconductor substrate 118 and may be interconnected by interconnect structures 120 formed by, for example, metallization patterns in one or more dielectric layers on the semiconductor substrate 118 to form an integrated circuit.

The integrated circuit dies 114 further comprise pads 122, such as aluminum pads, to which external connections are made. The pads 122 are on what may be referred to as respective active sides of the integrated circuit dies 114. Passivation films 124 are on the integrated circuit dies 114 and on portions of the pads 122. Openings are through the passivation films 124 to the pads 122. Die connectors 126, such as conductive pillars (for example, comprising a metal such as copper), are in the openings through passivation films 124 and are mechanically and electrically coupled to the respective pads 122. The die connectors 126 may be formed by, for example, plating, or the like. The die connectors 126 electrically couple the respective integrated circuits of the integrate circuit dies 114.

A dielectric material 128 is on the active sides of the integrated circuit dies 114, such as on the passivation films 124 and the die connectors 126. The dielectric material 128 laterally encapsulates the die connectors 126, and the dielectric material 128 is laterally coterminous with the respective integrated circuit dies 114. The dielectric material 128 may be a polymer such as PBO, polyimide, BCB, or the like; a nitride such as silicon nitride or the like; an oxide such as silicon oxide, PSG, BSG, BPSG, or the like; the like, or a combination thereof, and may be formed, for example, by spin coating, lamination, CVD, or the like.

Adhesive 116 is on back-sides of the integrated circuit dies 114 and adheres the integrated circuit dies 114 to the back-side redistribution structure 110, such as the metallization pattern 106 in the illustration. The adhesive 116 may be any suitable adhesive, epoxy, die attach film (DAF), or the like. The adhesive 116 may be applied to a back-side of the integrated circuit dies 114, such as to a back-side of the respective semiconductor wafer or may be applied over the surface of the carrier substrate 100. The integrated circuit dies 114 may be singulated, such as by sawing or dicing, and adhered to the dielectric layer 104 by the adhesive 116 using, for example, a pick-and-place tool.

Figure 5:
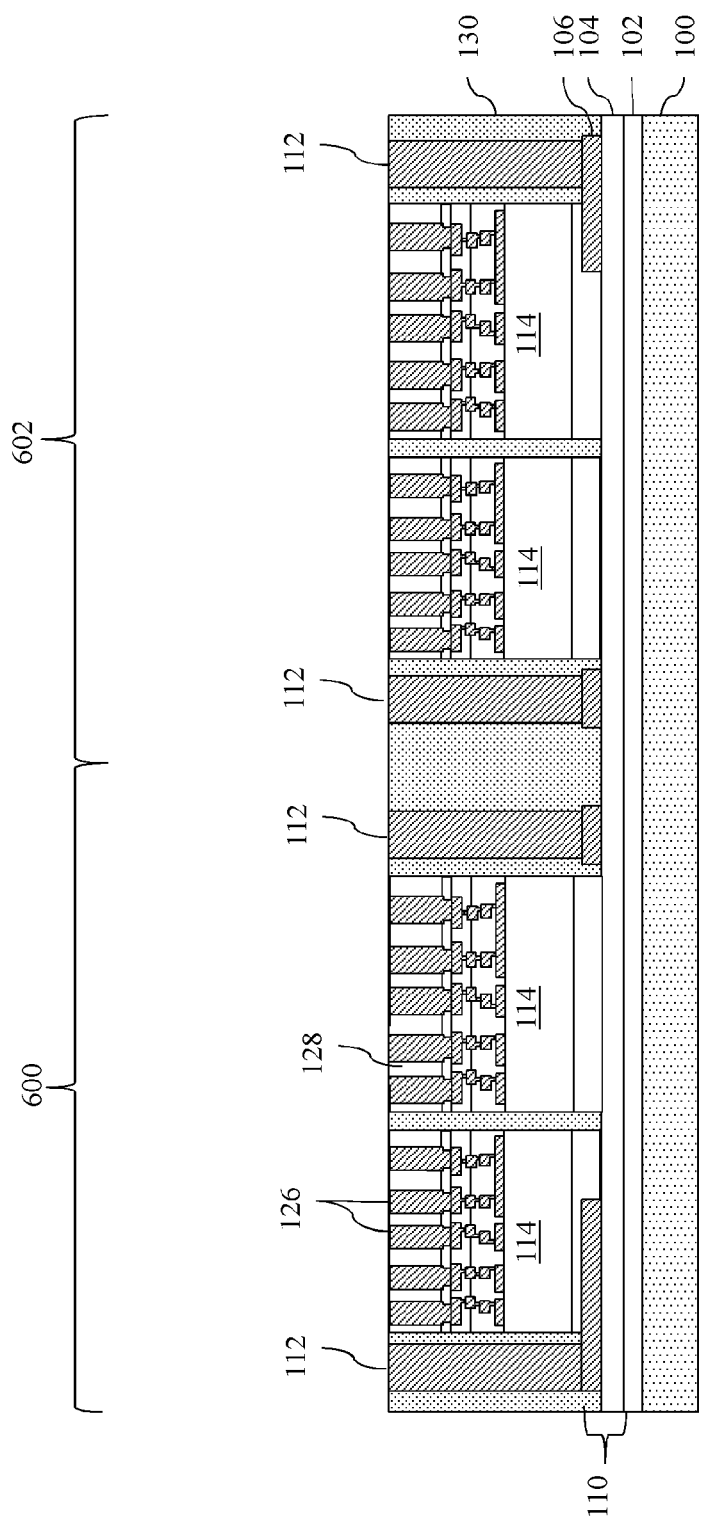

In FIG. 5, an encapsulant 130 is formed on the various components. The encapsulant 130 may be a molding compound, epoxy, or the like, and may be applied by compression molding, transfer molding, or the like. After curing, the encapsulant 130 can undergo a grinding process to expose the through vias 112 and die connectors 126. Top surfaces of the through vias 112, die connectors 126, and encapsulant 130 are coplanar after the grinding process. In some embodiments, the grinding may be omitted, for example, if through vias 112 and die connectors 126 are already exposed.

Figure 6:
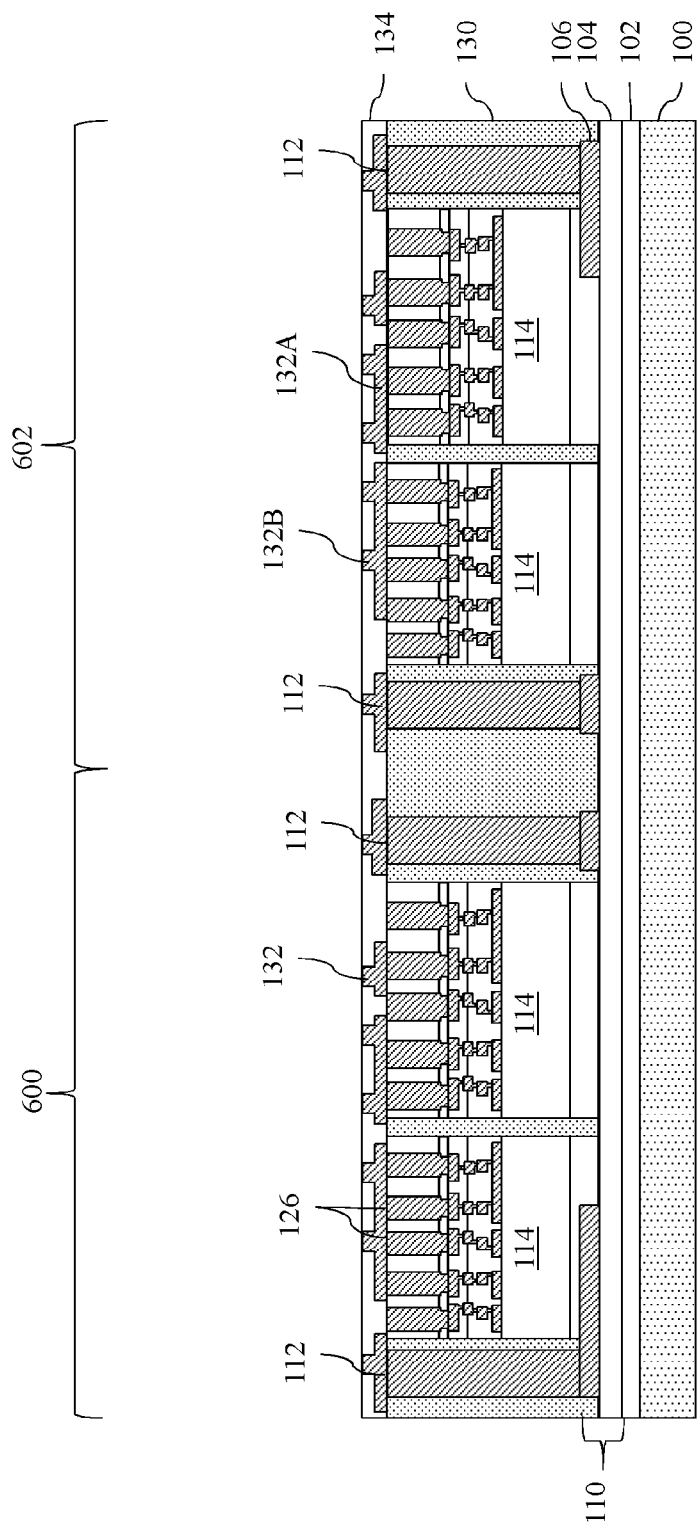
Figure 7:
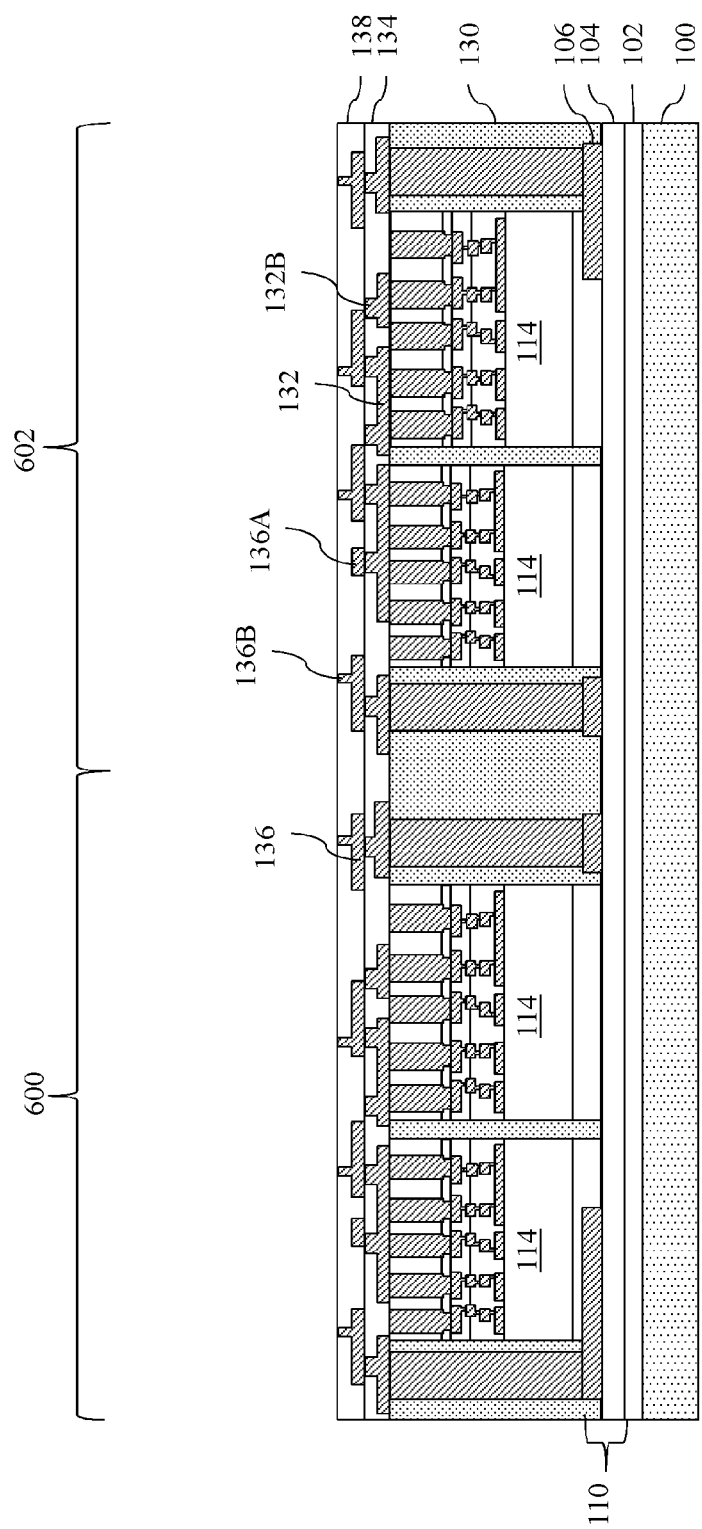
Figure 8:
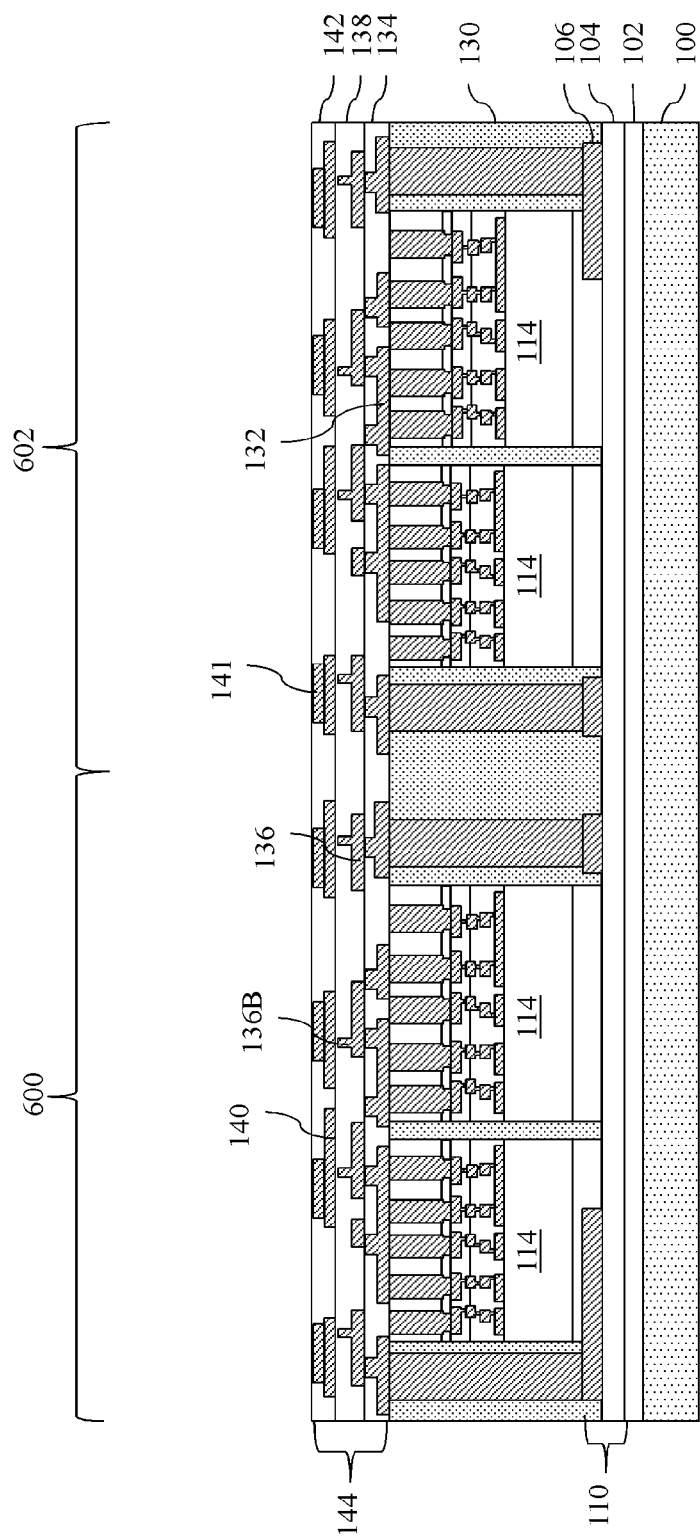

In FIGS. 6 through 8, a front-side redistribution structure 144 is formed. As will be illustrated in FIG. 8, the front-side redistribution structure 144 includes metallization patterns 132, 136, 140, and 141 and dielectric layers 134, 138, and 142. Referring first to FIG. 6, the metallization pattern 132 and the dielectric layer 134 is formed on the encapsulant 130, the through vias 112, and the die connectors 126. The metallization pattern 132 includes conductive lines 132A and conductive vias 132B. The conductive lines 132A may be formed directly on the encapsulant 130, the through vias 112, and the die connectors 126. For example, there may be no intermediary interconnect features (e.g., other conductive lines and/or vias) between the conductive lines 132A and the through vias 112/die connectors 126. The conductive lines 132A may provide electrical routing to route electrical signals (e.g., to/from the through vias 112 and/or the die connectors 126) to a different physical location depending on a desired layout design. The conductive vias 132B are formed over the conductive lines 132A, and the conductive vias 132B allow electrical signals to pass to upper layers, e.g., upper metallization patterns 136, 140, and 141 (see FIGS. 7 and 8). The dielectric layer 134 is formed around the metallization pattern 132. In some embodiments, the dielectric layer 134 is formed of a polymer, which may be a photo-sensitive material such as PBO, polyimide, BCB, or the like, that may be patterned using a lithography mask. In other embodiments, the dielectric layer 134 is formed of a nitride such as silicon nitride; an oxide such as silicon oxide, PSG, BSG, BPSG; or the like. The metallization pattern 132 and the dielectric layer 134 may be formed using any suitable formation process, such as the process described in the embodiments of FIGS. 9 through 17, FIGS. 18 through 20, FIGS. 21 through 23, and/or FIGS. 24 through 32.

Referring to FIG. 7, a metallization pattern 136 and a dielectric layer 138 are formed over the metallization pattern 132 and the dielectric layer 134. The metallization pattern 136 includes conductive lines 136A and conductive vias 136B. The conductive lines 136A may be formed directly on the metallization pattern 132 and the dielectric layer 134. For example, there may be no intermediary interconnect features (e.g., other conductive lines and/or vias) between the conductive lines 136A and the conductive vias 132B of the metallization pattern 132. The conductive lines 136A may provide electrical routing to route electrical signals (e.g., to/from conductive vias 132B) to a different physical location depending on a desired layout design. The conductive vias 136B are formed over the conductive lines 136A, and the conductive vias 136B allow electrical signals to pass to upper layers, e.g., upper metallization patterns 140 and 141 (see FIG. 8). The dielectric layer 138 is formed around the metallization pattern 136. In some embodiments, the dielectric layer 138 is formed of a polymer, which may be a photo-sensitive material such as PBO, polyimide, BCB, or the like, that may be patterned using a lithography mask. In other embodiments, the dielectric layer 138 is formed of a nitride such as silicon nitride; an oxide such as silicon oxide, PSG, BSG, BPSG; or the like. The metallization pattern 136 and the dielectric layer 138 may be formed using any suitable formation process, such as the process described in the embodiments of FIG. 9 through 17, FIGS. 18 through 20, FIGS. 21 through 23, and/or FIGS. 24 through 32.

Referring to FIG. 8, a metallization pattern 140, a metallization pattern 141, and a dielectric layer 142 are formed over the metallization pattern 136 and the dielectric 138. The metallization pattern 140 includes conductive lines, which may be formed directly on the metallization pattern 136 and the dielectric layer 138. For example, there may be no intermediary interconnect features (e.g., other conductive lines and/or vias) between the conductive lines of the metallization pattern 140 and the conductive vias 136B of the metallization pattern 136. The conductive lines of the metallization pattern 140 may provide electrical routing to route electrical signals (e.g., to/from conductive vias 136B) to a different physical location depending on a desired layout design.

As also illustrated by FIG. 8, metallization pattern 141 are formed on the metallization pattern 140. The metallization pattern 141 are used to couple to conductive connectors 148 and/or surface mount devices (SMDs) 146 (see FIG. 33) and may be referred to as under bump metallurgies (UBMs) 141. In the illustrated embodiment, the UBMs 141 are formed through openings in the dielectric layer 142 to the metallization pattern 140.

The dielectric layer 142 is formed around the metallization pattern 140 and the UBMs 141. In some embodiments, the dielectric layer 142 is formed of a polymer, which may be a photo-sensitive material such as PBO, polyimide, BCB, or the like, that may be patterned using a lithography mask. In other embodiments, the dielectric layer 142 is formed of a nitride such as silicon nitride; an oxide such as silicon oxide, PSG, BSG, BPSG; or the like. The metallization pattern 140, UBMs 141, and the dielectric layer 142 may be formed using any suitable formation process, such as the process described in the embodiments of FIGS. 9 through 17, FIGS. 18 through 20, FIGS. 21 through 23, and/or FIGS. 24 through 32.

Figure 9:
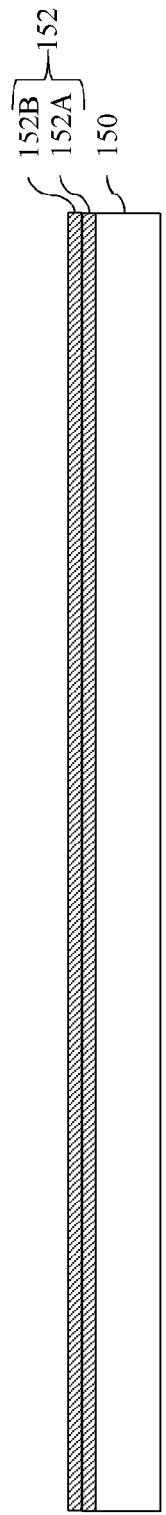

FIGS. 9 through 17 illustrate various intermediary steps of forming a metallization pattern (e.g., the metallization patterns 132, 136, 140, and/or 141) in a dielectric layer (e.g., dielectric layer 134, 138, and/or 142). Referring to FIG. 9, a substrate 150 is illustrated. Substrate 150 may be any layer immediately underlying a subsequently formed metallization pattern/dielectric layer. For example, the substrate 150 may include a metallization pattern in a dielectric layer. Alternatively, the substrate 150 may include die connectors to an integrated circuit die, an encapsulant, and through vias. In yet other embodiments, the substrate 150 may include any suitable combination of material(s) depending on package design.

As also illustrated by FIG. 9, a seed layer 152 is formed over the substrate 150. In some embodiments, the seed layer is a metal layer, which may be a single layer or a composite layer comprising a plurality of sub-layers formed of different materials. For example, the seed layer 152 may comprise titanium, copper, molybdenum, tungsten, titanium nitride, titanium tungsten, combinations thereof, or the like. In some embodiments, the seed layer comprises a titanium layer 152A and a copper layer 152B over the titanium layer 152A. The seed layer 152 may be formed using, for example, PVD or the like. In some embodiments a top surface of substrate 150 (e.g., a surface on which seed layer 152 is formed) is substantially coplanar. When seed layer 152 is deposited on the top surface of substrate 150, a top surface of seed layer 152 may adopt a profile of the top surface of substrate 150. For example, seed layer 152 may have a top surface that is also substantially coplanar.

Figure 10:
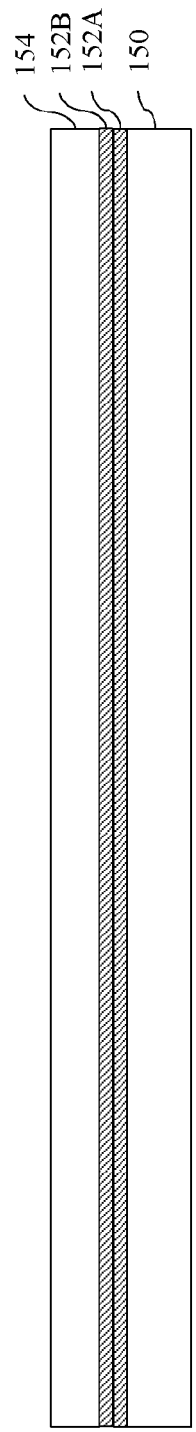
Figure 11:
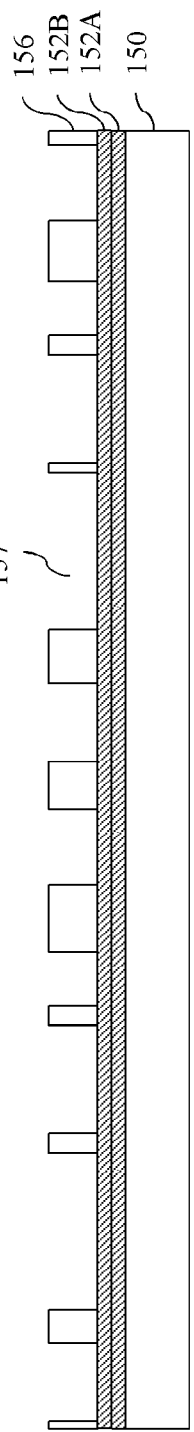

In FIGS. 10 and 11, a first mask 154 is formed and patterned on the seed layer 152. In some embodiments, the first mask is a photo resist and may be referred to as first photo resist 154 hereinafter. The first photo resist 154 may be formed by spin coating as a blanket layer (see FIG. 10). After the first photo resist 154 is deposited, the first photo resist 154 may be exposed, for example to UV light or another radiation source through a patterned photomask. The first photo resist 154 may then be developed and either exposed or unexposed portions of the first photo resist 154 is removed depending on whether a positive or negative resist is used. The resulting patterned first photo resist 156 is illustrated in FIG. 11, which illustrates the patterned first photo resist 156 having openings 157 extending therethrough. The pattern of the patterned first photo resist 156 corresponds to conductive lines 158 of the metallization pattern (see FIG. 12). The openings 157 extend through the patterned first photo resist 156 and exposes the seed layer 152.

Figure 12:
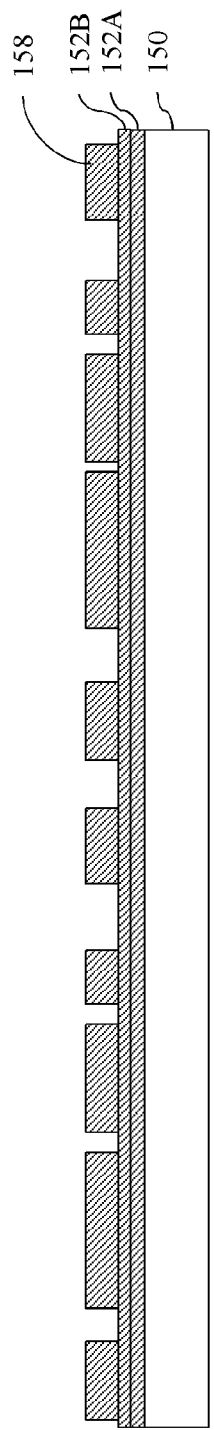
Figure 13:
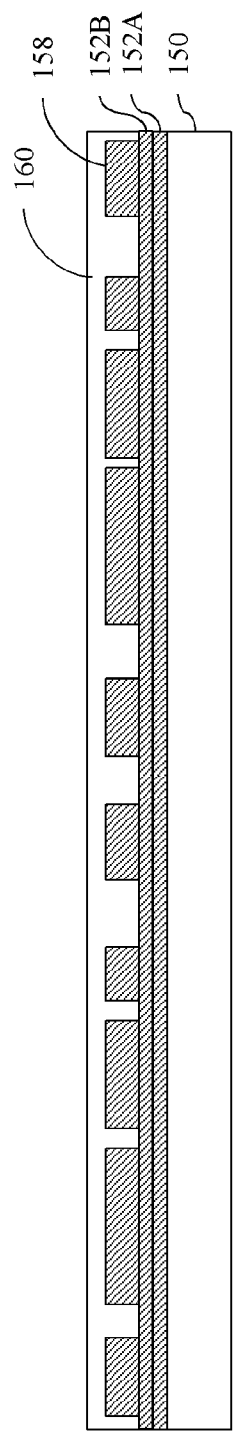
Figure 14:
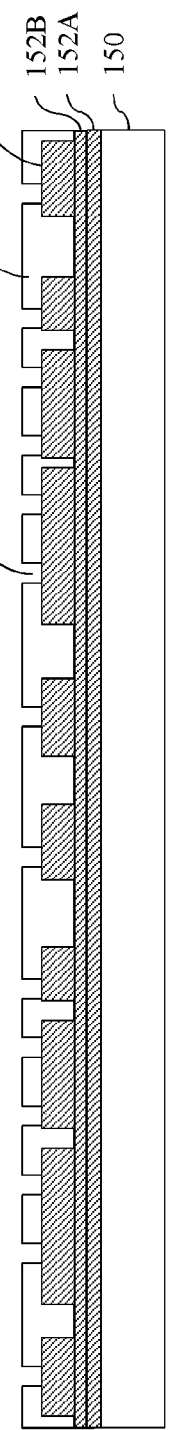

Subsequently, in FIG. 12, a conductive material (a portion of conductive lines 158) is formed in the openings 157 of the patterned first photo resist 156 (see FIG. 11) and on the exposed portions of the seed layer 152. The conductive lines 158 may be formed by plating, such as electroplating or electroless plating, or the like. The conductive lines 158 may comprise a metal, like copper, titanium, tungsten, aluminum, or the like. Then, as also illustrated by FIG. 12, the patterned first photo resist 156 is removed by an acceptable ashing or stripping process, such as using an oxygen plasma or the like. The conductive lines 158 may correspond to the conductive lines 132A, the conductive lines 136A, and/or the metallization pattern 140 of FIGS. 6 through 8. For example, the conductive lines 132A, the conductive lines 136A, and/or the metallization pattern 140 may be formed using a process similar to the conductive lines 158 as described herein.

Figure 15:
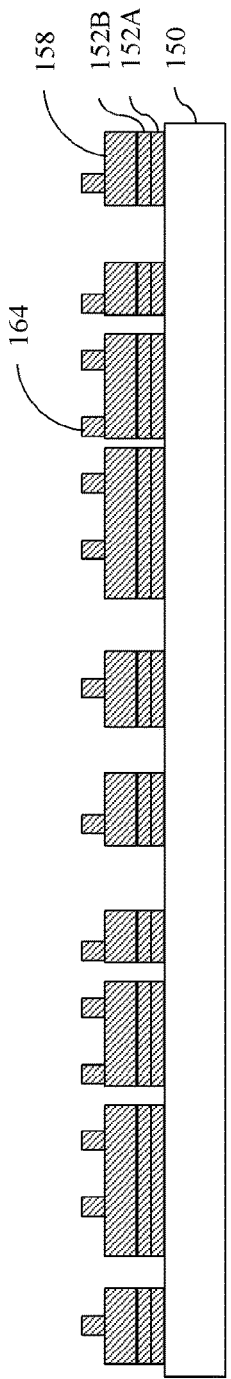

Once the patterned first photo resist 156 is removed, a second mask 160 is deposited over the seed layer 152 and the conductive lines 158. In some embodiments, the second mask is a photo resist and may be referred to as second photo resist 160 hereinafter. The second photo resist 160 may be formed by spin coating as a blanket layer (see FIG. 13). After the second photo resist 160 is deposited, the second photo resist 160 may be exposed, for example to UV light or another radiation source through a patterned photomask. The second photo resist 160 may then be developed and either exposed or unexposed portions of the second photo resist 160 is removed depending on whether a positive or negative resist is used. The resulting patterned second photo resist 162 having openings 161 extending therethrough is illustrated in FIG. 15. The pattern of the patterned second photo resist 162 corresponds to the conductive vias 164 of the metallization pattern (see FIG. 15). The openings 161 extend through the patterned second photo resist 162 and exposes the conductive lines 158.

In some embodiments, a material of the patterned second photo resist 162 and/or the patterned first photo resist 156 may support relatively high resolution lithography patterning, which allows for the formation of relatively fine-pitched openings. For example, in an embodiment, a width of each opening 161 may be less than about 1 µm. By employing a high resolution photo resist material, subsequently formed features in the openings 161 (e.g., conductive vias 164, see FIG. 15) may have smaller dimensions. Thus, a density of metallization features can be advantageously increased. In some embodiments, the patterned first photo resist 156 and/or the patterned second photo resist 162 may comprise amino compounds such as melamine resins, urea resins, guanamine resins, glycoluril-formaldehyde resins, succinamide-formaldehyde resins, ethylene urea-formaldehyde resins, and combinations thereof.

Subsequently, in FIG. 15, a conductive material (e.g., conductive vias 164) is formed in the openings 161 (see FIG.

14) and on the exposed portions of the conductive lines 158. Forming the conductive vias 164 uses the conductive lines 158 as a seed layer without depositing separate seed layer(s) for the conductive vias 164, which allows the conductive vias 164 to be formed at a relatively low manufacturing cost. The conductive vias 164 may be formed by plating, such as electroplating or electroless plating, or the like. The conductive vias 164 may comprise a metal, like copper, titanium, tungsten, aluminum, or the like. Then, as also illustrated by FIG. 15, the patterned second photo resist 162 is removed by an acceptable ashing or stripping process, such as using an oxygen plasma or the like. The conductive vias 164 may correspond to the conductive vias 132B, the conductive vias 136B, and/or the UBMs 141 of FIGS. 6 through 8. For example, the conductive vias 136B, the conductive vias 132B, and/or the UBMs 141 may be formed using a process similar to the conductive vias 164 as described herein.

After the patterned second photo resist 162 is removed, exposed portions of the seed layer 152 are removed, such as by using an acceptable etching process, such as by wet or dry etching. The remaining portions of the seed layer 152 and conductive material form a metallization pattern comprising the conductive lines 158 and the conductive vias 164.

Figure 16:
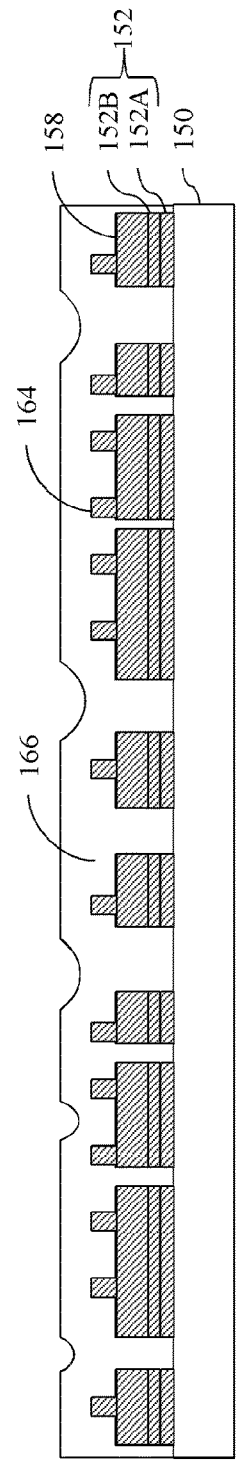
Figure 17:
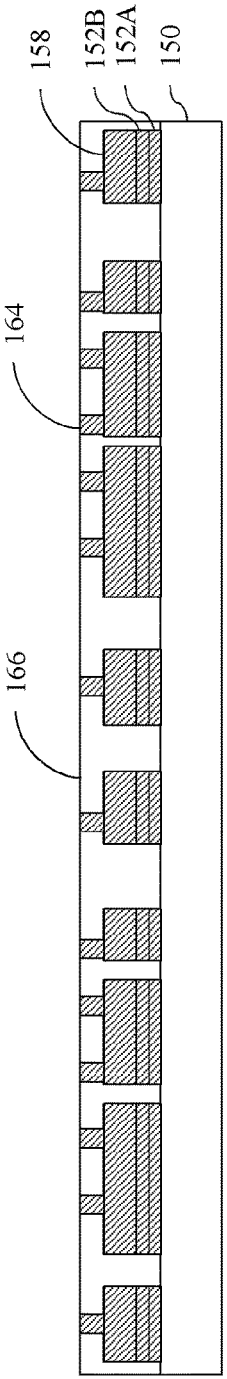

In FIGS. 16 and 17, a dielectric layer 166 is deposited around the conductive lines 158 and the conductive vias 164. In some embodiments, the dielectric layer 166 is formed of a polymer, which may be a photo-sensitive material such as PBO, polyimide, BCB, or the like, that may be patterned using a lithography mask. In other embodiments, the dielectric layer 166 is formed of a nitride such as silicon nitride; an oxide such as silicon oxide, PSG, BSG, BPSG; or the like. The dielectric layer 166 may be formed by spin coating, lamination, CVD, the like, or a combination thereof. In embodiments where the dielectric layer 166 comprises a photosensitive material, the dielectric layer 166 may comprise a different type of material than the first photo resist 154 (see FIG. 10) and/or the second photo resist 160 (see FIG. 13). For example, the first photo resist 154 and/or the second photo resist 160 may support a higher resolution lithography process than the dielectric layer 166.

The dielectric layer 166 may be initially formed to completely cover top surfaces of the conductive lines 158 and the conductive vias 164 as illustrated by FIG. 16. Subsequently, a CMP or other suitable planarization process may be applied to the dielectric layer 166 to level a top surface of the dielectric layer 166 and to expose the conductive vias 164. The dielectric layer 166 may correspond to the dielectric layer 134, the dielectric layer 138, and/or the dielectric layer 142 of FIGS. 6 through 8. For example, the dielectric layer 134, the dielectric layer 138, and/or the dielectric layer 142 may be formed using a process similar to the dielectric layer 166. Subsequently, additional features may be formed over the dielectric layer 166 and the conductive vias 164. For example, additional metallization patterns in dielectric layers may be formed over the dielectric layer 166 by repeating the process described in FIGS. 9 through 17.

In the process of FIGS. 9 through 17, the openings 161 in the patterned second photo resist 162 (see FIG. 14) are aligned with the conductive lines 158 so that the patterned second photo resist 162 only exposes a top surface of the conductive lines 158. In other embodiments, the patterned second photo resist 162 exposes top surfaces of the conductive lines 158 as well as sidewalls of the conductive lines 158.

Figure 18:
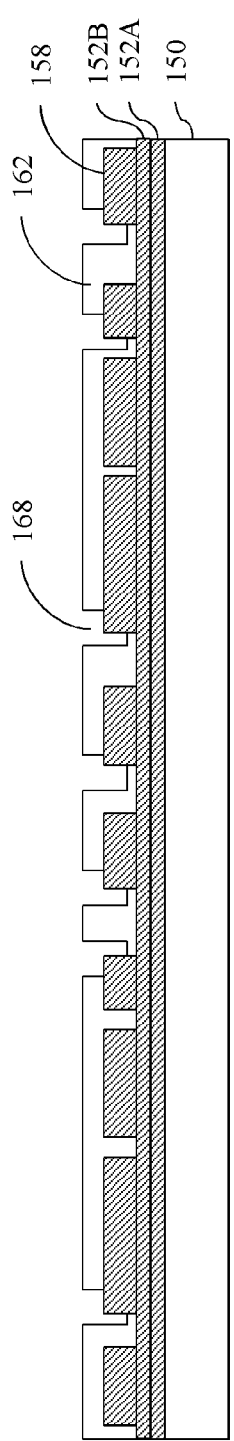
Figure 19:
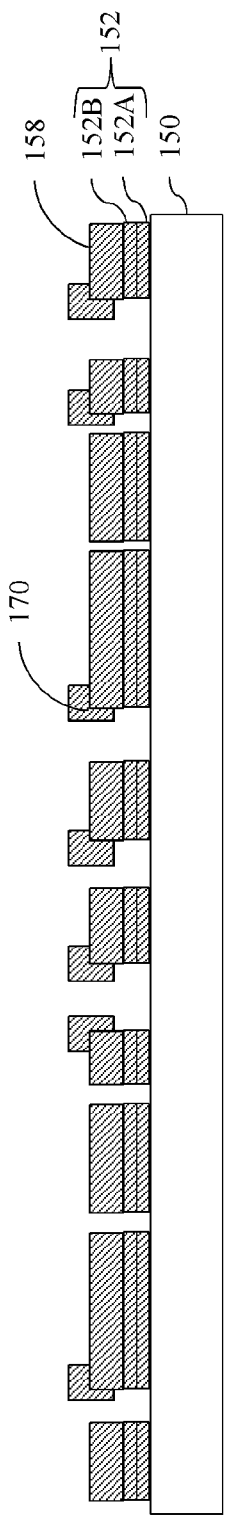
Figure 20:
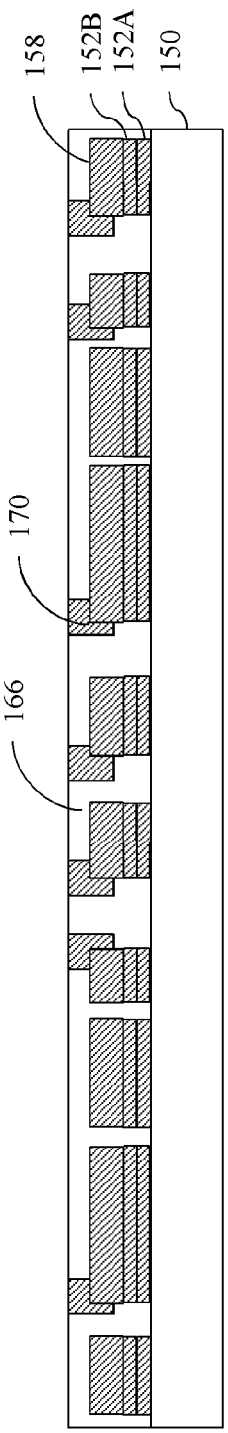

For example, FIGS. 18 to 20 illustrate various intermediary steps of forming a metallization pattern according to some embodiments. In FIG. 18, a patterned second photo resist 162 is formed over the conductive lines 158. The various features of FIG. 18 may be similar to features in 14 where like reference numerals indicate like elements formed using like processes, such as, those processes described in FIGS. 9 through 14.

As illustrated by FIG. 18, openings 168 are formed in the patterned second photo resist 162. The openings 168 expose top surfaces as well as sidewalls of the conductive lines 158, and a bottom surface of the openings 168 may be defined by a material of the conductive lines 158 as well as a material of the patterned second photo resist 162. In FIG. 18, the openings 168 extend only partially through the patterned second photo resist 162. For example, portions of the patterned second photo resist 162 are disposed between bottom surfaces of the openings 168 and a top surface of the seed layer 152. A depth of the openings 168 may be controlled, for example, by controlling exposure conditions (e.g., focus, energy, or the like) during the photolithography process.

Subsequently, in FIG. 19, a conductive material (conductive vias 170) is formed in the openings 168 of the patterned second photo resist 162 (see FIG. 18) and on the exposed portions of the conductive lines 158. Forming the conductive vias 170 uses the conductive lines 158 as a seed layer without depositing separate seed layer(s) for the conductive vias 170, which allows the conductive vias 170 to be formed at a relatively low manufacturing cost. The conductive vias 170 may be formed by plating, such as electroplating or electroless plating, or the like. The conductive vias 170 may comprise a metal, like copper, titanium, tungsten, aluminum, or the like. Then, as also illustrated by FIG. 19, the patterned second photo resist 162 is removed by an acceptable ashing or stripping process, such as using an oxygen plasma or the like. The patterned second photo resist 162 be removed by an acceptable ashing or stripping process, such as using an oxygen plasma or the like. The conductive vias 170 may correspond to the conductive vias 132B, the conductive vias 136B, and/or the UBMs 141 of FIGS. 6 through 8. For example, the conductive vias 132B, the conductive vias 136B, and/or the UBMs 141 may be formed using a process similar to the conductive vias 170 as described herein.

Subsequently, the patterned second photo resist 162 is removed by an acceptable ashing or stripping process, such as using an oxygen plasma or the like. After the patterned second photo resist 162 is removed, exposed portions of the seed layer 152 are removed, such as by using an acceptable etching process, such as by wet or dry etching. The remaining portions of the seed layer and conductive material form a metallization pattern comprising the conductive lines 158 and the conductive vias 170.

Due to the position of the openings 168 (see FIG. 18), the position of the conductive vias 170 may likewise be different than the conductive vias 164 (see FIG. 17). For example, the conductive vias 170 may only partially overlap the underlying conductive lines 158, and portions of the conductive vias 170 may overhang and extend further than the underlying conductive line 158.

Subsequently, as illustrated by FIG. 20, the dielectric layer 166 is deposited around the conductive lines 158 and the conductive vias 170. The dielectric layer 166 may be deposited to cover the conductive lines 158 and the conductive vias 170. After deposition, a CMP or other planarization process may be applied to the dielectric layer 166 to expose the conductive vias 170 and improve a planarity of a top surface of the dielectric layer 166. A portion of the dielectric layer 166 may be disposed between a bottom surface of the conductive vias 170 and a layer immediately underlying the dielectric layer 166 (e.g., the substrate 150). Subsequently, additional features may be formed over the dielectric layer 166 and the conductive vias 170. For example, additional metallization patterns in dielectric layers may be formed over the dielectric layer 166 by repeating the process described in FIGS. 18 through 20.

Figure 21:
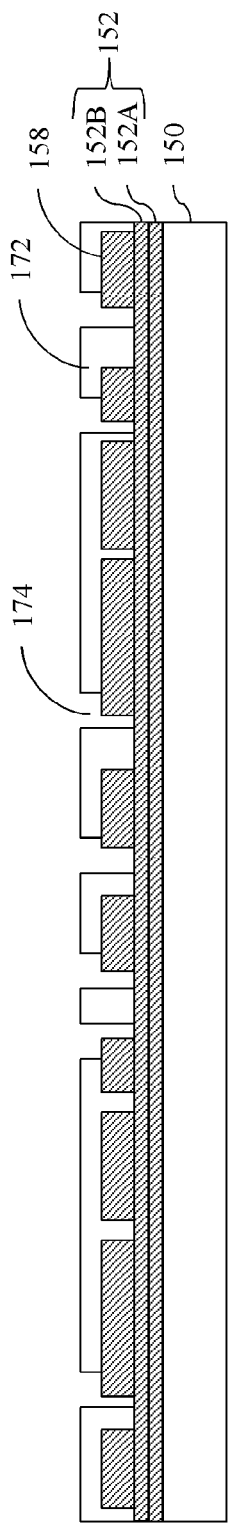
Figure 22:
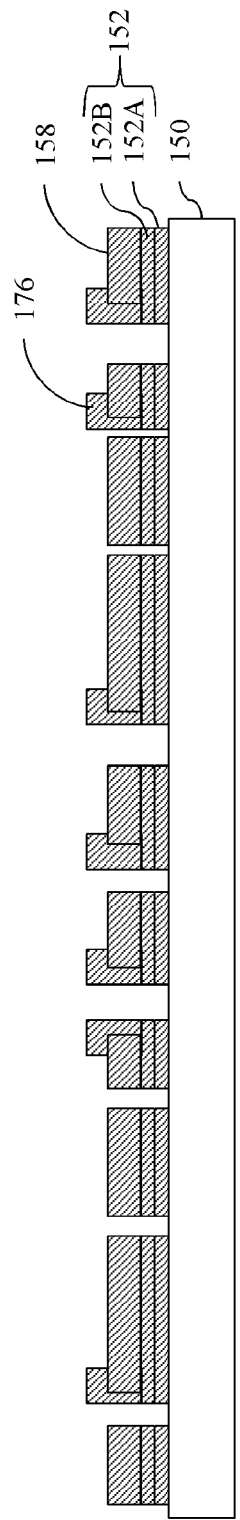
Figure 23:
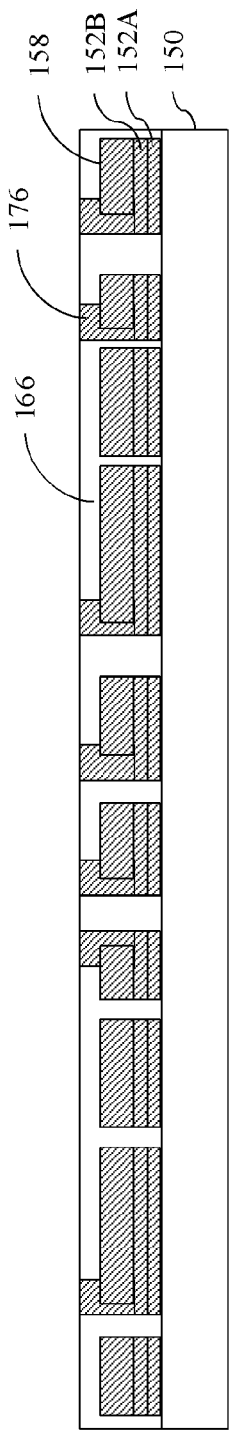

FIGS. 21 to 23 illustrate various intermediary steps of forming a metallization pattern according to some other embodiments. In FIG. 21, a patterned second photo resist 162 is formed over the conductive lines 158. The various features of FIG. 21 may be similar to features in 14 where like reference numerals indicate like elements formed using like processes, such as, those processes described in FIGS. 9 through 14.

As illustrated by FIG. 21, openings 174 are formed in the patterned second photo resist 162. The openings 174 expose top surfaces as well as sidewalls of the conductive lines 158, and a bottom surface of the openings 168 may be defined by a material of the conductive lines 158 as well as a material of the seed layer 152. Unlike the openings 168 (see FIG. 18), the openings 174 extend completely through the patterned second photo resist 162 to expose the seed layer 152. A depth of the openings 174 may be controlled, for example, by controlling exposure conditions (e.g., focus, energy, or the like) during the photolithography process.

Subsequently, in FIG. 22, a conductive material (conductive vias 176) is formed in the openings 174 of the patterned second photo resist 162 (see FIG. 21) and on the exposed portions of the conductive lines 158 and the seed layer 152. Forming the conductive vias 176 uses the conductive lines 158 and the seed layer 152 as seed layers without depositing separate seed layer(s) for the conductive vias 176. This allows the conductive vias 176 to be formed at a relatively low manufacturing cost. The conductive vias 176 may be formed by plating, such as electroplating or electroless plating, or the like. The conductive vias 176 may comprise a metal, like copper, titanium, tungsten, aluminum, or the like. Then, as also illustrated by FIG. 22, the patterned second photo resist 162 is removed by an acceptable ashing or stripping process, such as using an oxygen plasma or the like. The patterned second photo resist 162 be removed by an acceptable ashing or stripping process, such as using an oxygen plasma or the like. The conductive vias 176 may correspond to the conductive vias 132B, the conductive vias 136B and/or the UBMs 141 of FIGS. 6 through 8. For example, the conductive vias 132B, the conductive vias 136B, and/or the UBMs 141 may be formed using a process similar to the conductive vias 176 as described herein.

Subsequently, the patterned second photo resist 162 is removed by an acceptable ashing or stripping process, such as using an oxygen plasma or the like. After the patterned second photo resist 162 is removed, exposed portions of the seed layer 152 are removed, such as by using an acceptable etching process, such as by wet or dry etching. The remaining portions of the seed layer and conductive material form a metallization pattern comprising the conductive lines 158 and the conductive vias 176.

Due to the position of the openings 174 (see FIG. 21), the position of the conductive vias 176 may likewise be different than the conductive vias 164 (see FIG. 17) or the conductive vias 170 (see FIG. 19). For example, the conductive vias 176 may be disposed at edges of the conductive lines 158, and a line extending along a sidewall of a conductive via 176 may also extend along a sidewall of a conductive line 158.

Subsequently, as illustrated by FIG. 23, the dielectric layer 166 is deposited around the conductive lines 158 and the conductive vias 176. The dielectric layer 166 may be deposited to cover the conductive lines 158 and the conductive vias 176. After deposition, a CMP or other planarization process may be applied to the dielectric layer 166 to expose the conductive vias 176 and improve a planarity of a top surface of the dielectric layer 166. Subsequently, additional features may be formed over the dielectric layer 166 and the conductive vias 176. For example, additional metallization patterns in dielectric layers may be formed over the dielectric layer 166 by repeating the process described in FIGS. 21 through 23.

Figure 24:
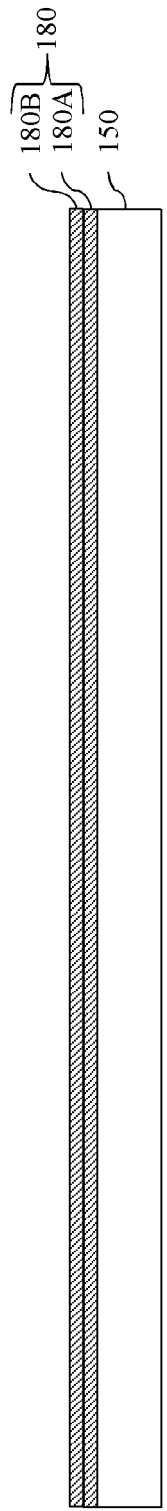

FIGS. 24 through 32 illustrate various intermediary steps of forming a metallization pattern (e.g., the metallization patterns 132, 136, 140, and/or 141) in a dielectric layer (e.g., dielectric layer 134, 138, and/or 142) according to some other embodiments. Referring to FIG. 24, a substrate 150 is illustrated. Substrate 150 may be any layer immediately underlying a subsequently formed metallization pattern/dielectric layer. For example, the substrate 150 may include a metallization pattern in a dielectric layer. Alternatively, the substrate 150 may include connectors to an integrated circuit die, an encapsulant, and through vias. In yet other embodiments, the substrate 150 may include any suitable material(s).

As also illustrated by FIG. 24, a seed layer 180 is formed over the substrate 150. In some embodiments, the seed layer is a metal layer, which may be a single layer or a composite layer comprising a plurality of sub-layers formed of different materials. For example, the seed layer 180 may comprise titanium, copper, molybdenum, tungsten, titanium nitride, titanium tungsten, combinations thereof, or the like. In some embodiments, the seed layer comprises a titanium layer 180A and a copper layer 180B over the titanium layer 180A. The seed layer 180 may be formed using, for example, PVD or the like.

Figure 25:
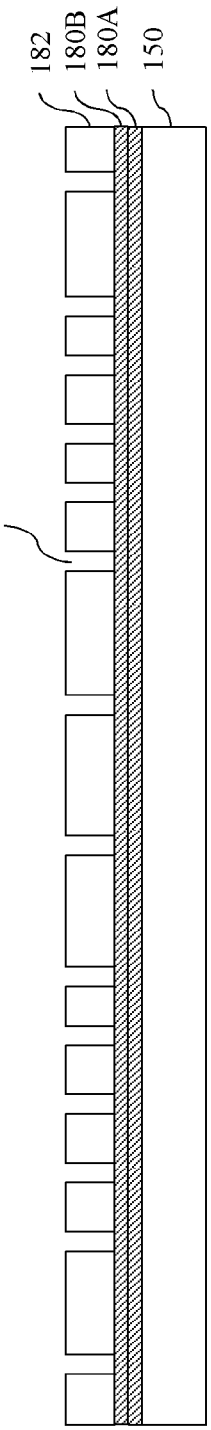

In FIG. 25, a patterned first photo resist 182 is formed on the seed layer 180. The patterned first photo resist 182 may be formed by spin coating as a blanket layer a photo resist material. In some embodiments, the patterned first photo resist 182 may comprise amino compounds such as melamine resins, urea resins, guanamine resins, glycoluril-formaldehyde resins, succinamide-formaldehyde resins, ethylene urea-formaldehyde resins, and combinations thereof. After the photo resist material is deposited, the photo resist material may be exposed, for example to UV light or another radiation source through a patterned photomask. The photo resist material may then be developed and exposed or unexposed portions of the photo resist material is removed depending on whether a positive or negative resist is used. The resulting patterned first photo resist 182 is illustrated in FIG. 25, which illustrates the patterned first photo resist 182 having openings 184 extending therethrough. The pattern of the patterned first photo resist 182 corresponds to conductive vias 186 of the metallization pattern (see FIG. 26). The openings 184 extend through the patterned first photo resist 182 and exposes the seed layer 180.

Figure 26:
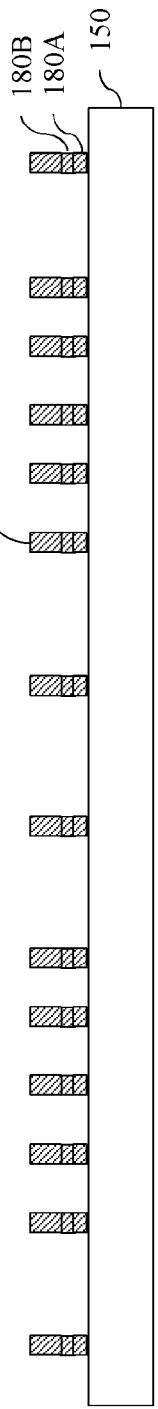

Subsequently, in FIG. 26, a conductive material (conductive vias 186) is formed in the openings 184 of the patterned first photo resist 182 (see FIG. 25) and on the exposed portions of the seed layer 180. The conductive vias 186 may be formed by plating, such as electroplating or electroless plating, or the like. The conductive vias 186 may comprise a metal, like copper, titanium, tungsten, aluminum, or the like. Then, as also illustrated by FIG. 26, the patterned first photo resist 182 is removed by an acceptable ashing or stripping process, such as using an oxygen plasma or the like. The conductive vias 186 may correspond to the conductive vias 132B, the conductive vias 136B, and/or the UBMs 141 of FIGS. 6 through 8. For example, the conductive vias 132B, the conductive vias 136B, and/or the UBMs 141 may be formed using a process similar to the conductive vias 186 as described herein.

Figure 27:
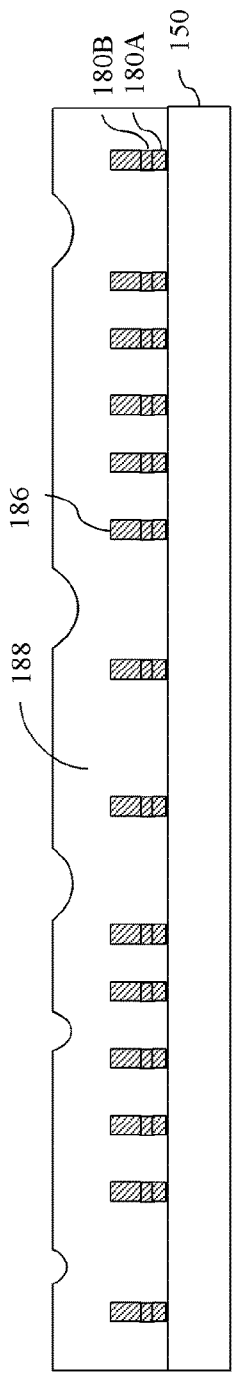

Once the patterned first photo resist 182 is removed, a dielectric layer 188 is deposited around the conductive vias 186 as illustrated by FIG. 27. In some embodiments, the dielectric layer 188 is formed of a polymer, which may be a photo-sensitive material such as PBO, polyimide, BCB, or the like, that may be patterned using a lithography mask. In other embodiments, the dielectric layer 188 is formed of a nitride such as silicon nitride; an oxide such as silicon oxide, PSG, BSG, BPSG; or the like. In embodiments where the dielectric layer 188 comprises a photosensitive material, the dielectric layer 166 may comprise a different type of material than the patterned first photo resist 182 (see FIG. 25). For example, the patterned first photo resist 182 may support a higher resolution lithography process than the dielectric layer 166.

Figure 28:
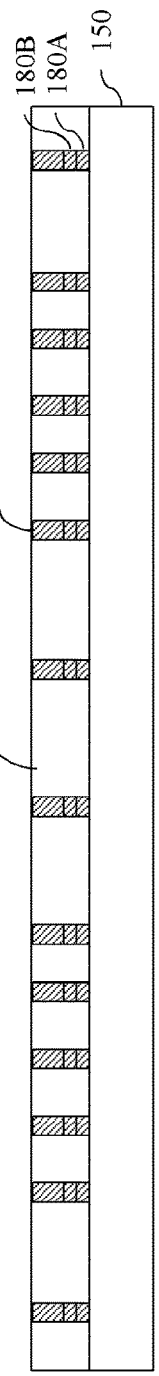

The dielectric layer 188 may be formed by spin coating, lamination, CVD, the like, or a combination thereof. The dielectric layer 188 may be initially formed to completely cover top surfaces of the conductive vias 182 as illustrated by FIG. 27. Subsequently, a CMP or other suitable planarization process may be applied to the dielectric layer 188 to level a top surface of the dielectric layer 188 and to expose the conductive vias 186 as illustrated by FIG. 28.

Figure 29:
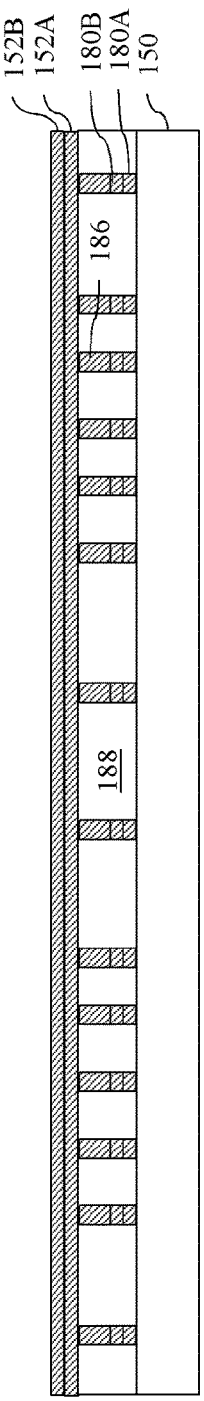
Figure 30:
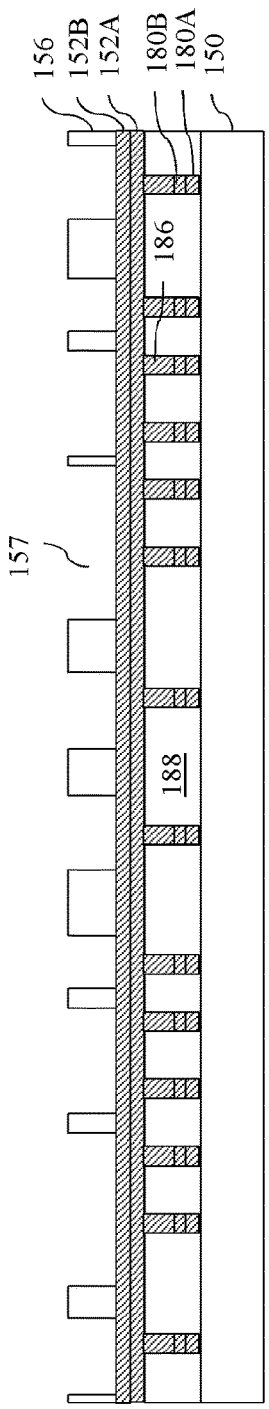
Figure 31:
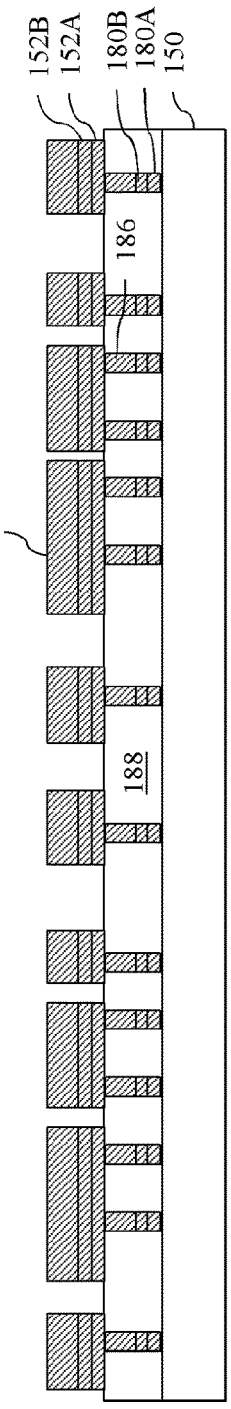

Subsequently, in FIGS. 29 through 31, conductive lines 158 are formed over the dielectric layer 188 and the conductive vias 186. The conductive lines 158 may be electrically connected to the underlying conductive vias 186. Forming the conductive lines 158 may include similar processes as those described in FIGS. 9 through 12 where like reference numerals indicate like elements. After the conductive lines 158 are formed, exposed portions of the seed layer 152 are removed, such as by using an acceptable etching process, such as by wet or dry etching. The remaining portions of the seed layer and conductive material form a metallization pattern comprising the conductive lines 158.

Figure 32:
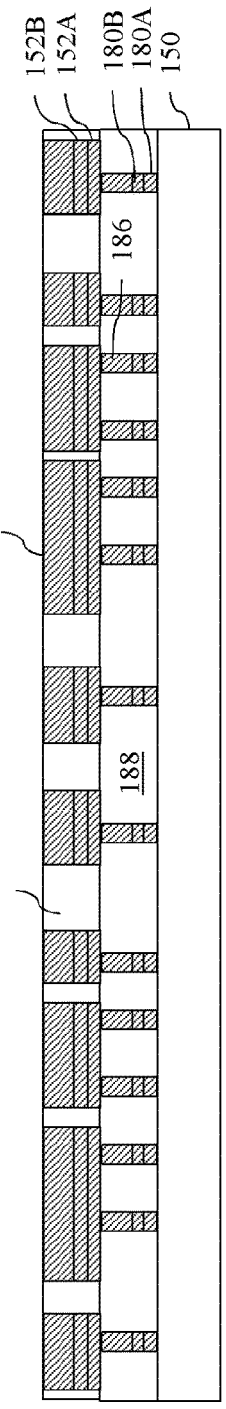

Next, as illustrated by FIG. 32, the dielectric layer 166 is deposited around the conductive lines 158. The dielectric layer 166 may be deposited to cover the conductive lines 158. After deposition, a CMP or other planarization process may be applied to the dielectric layer 166 to expose the conductive lines 158 and improve a planarity of a top surface of the dielectric layer 166. Subsequently, additional features may be formed over the dielectric layer 166 and the conductive lines 158. For example, additional metallization patterns in dielectric layers may be formed over the dielectric layer 166 by repeating the process described in FIGS. 24 through 32.

FIGS. 33 through 36 illustrate cross-sectional views of intermediate steps during a process for further forming a first package and for attaching other package structures to the first package in accordance with some embodiments. The processes of FIGS. 33 through 36 may be performed after forming metallization patterns in front-side redistribution structure 144 using the various embodiment processes described herein.

Figure 33:
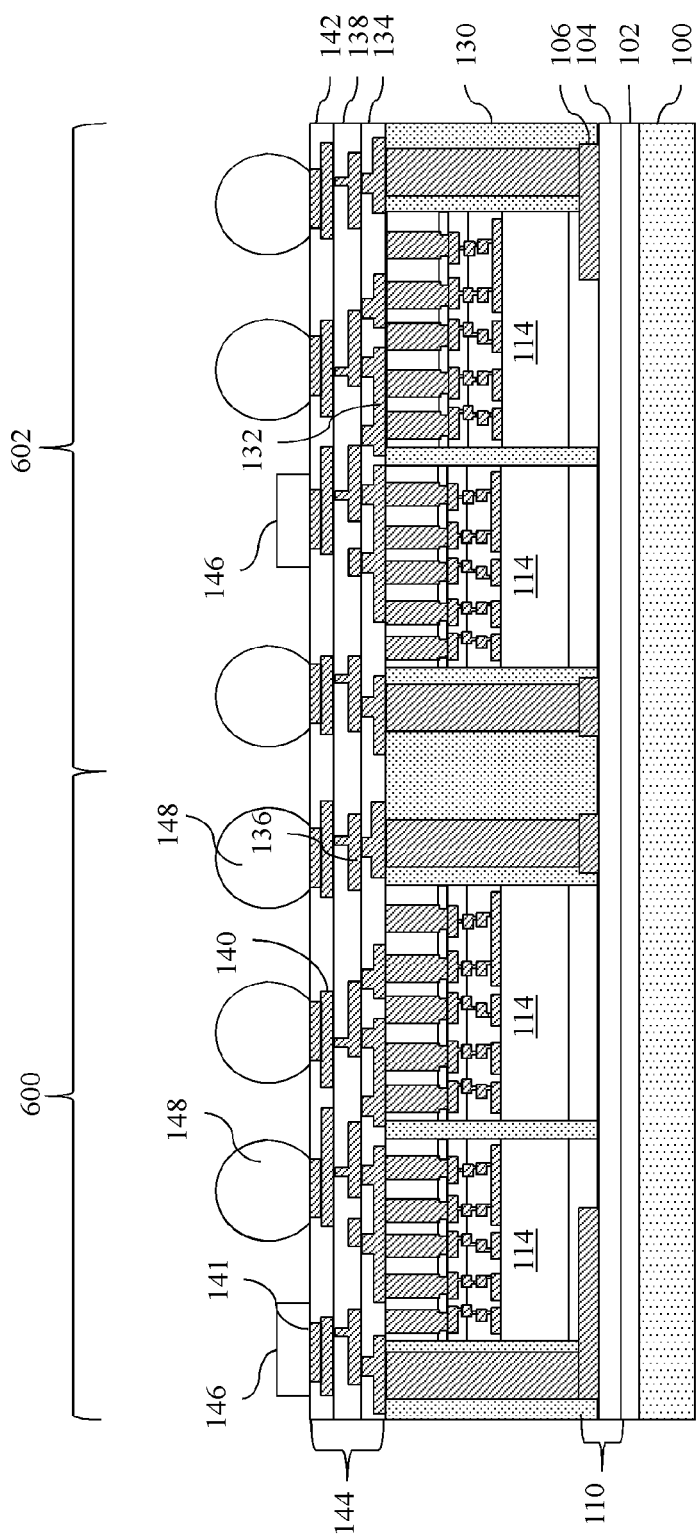

Referring to FIG. 33, conductive connectors 148 are formed on the UBMs 141. The conductive connectors 148 may be BGA connectors, solder balls, metal pillars, controlled collapse chip connection (C4) bumps, micro bumps, electroless nickel-electroless palladium-immersion gold technique (ENEPIG) formed bumps, or the like. The conductive connectors 148 may include a conductive material such as solder, copper, aluminum, gold, nickel, silver, palladium, tin, the like, or a combination thereof. In some embodiments, the conductive connectors 148 are formed by initially forming a layer of solder through such commonly used methods such as evaporation, electroplating, printing solder transfer, ball placement, or the like. Once a layer of solder has been formed on the structure, a reflow may be performed in order to shape the material into the desired bump shapes. In another embodiment, the conductive connectors 148 are metal pillars (such as a copper pillar) formed by a sputtering, printing, electro plating, electroless plating, CVD, or the like. The metal pillars may be solder free and have substantially vertical sidewalls. In some embodiments, a metal cap layer (not shown) is formed on the top of the metal pillar connectors 148. The metal cap layer may include nickel, tin, tin-lead, gold, silver, palladium, indium, nickel-palladium-gold, nickel-gold, the like, or a combination thereof and may be formed by a plating process.

As further illustrated by FIG. 33, surface mount device (SMDs) 146 may also be formed on the UBMs 141. SMDs 146 may include passive devices such as, capacitors, resistors, inductors, combinations thereof, or the like. SMDs 146 may be electrically connected to the integrated circuit dies 114 through the metallization patterns in the redistribution structure 144.

Figure 34:
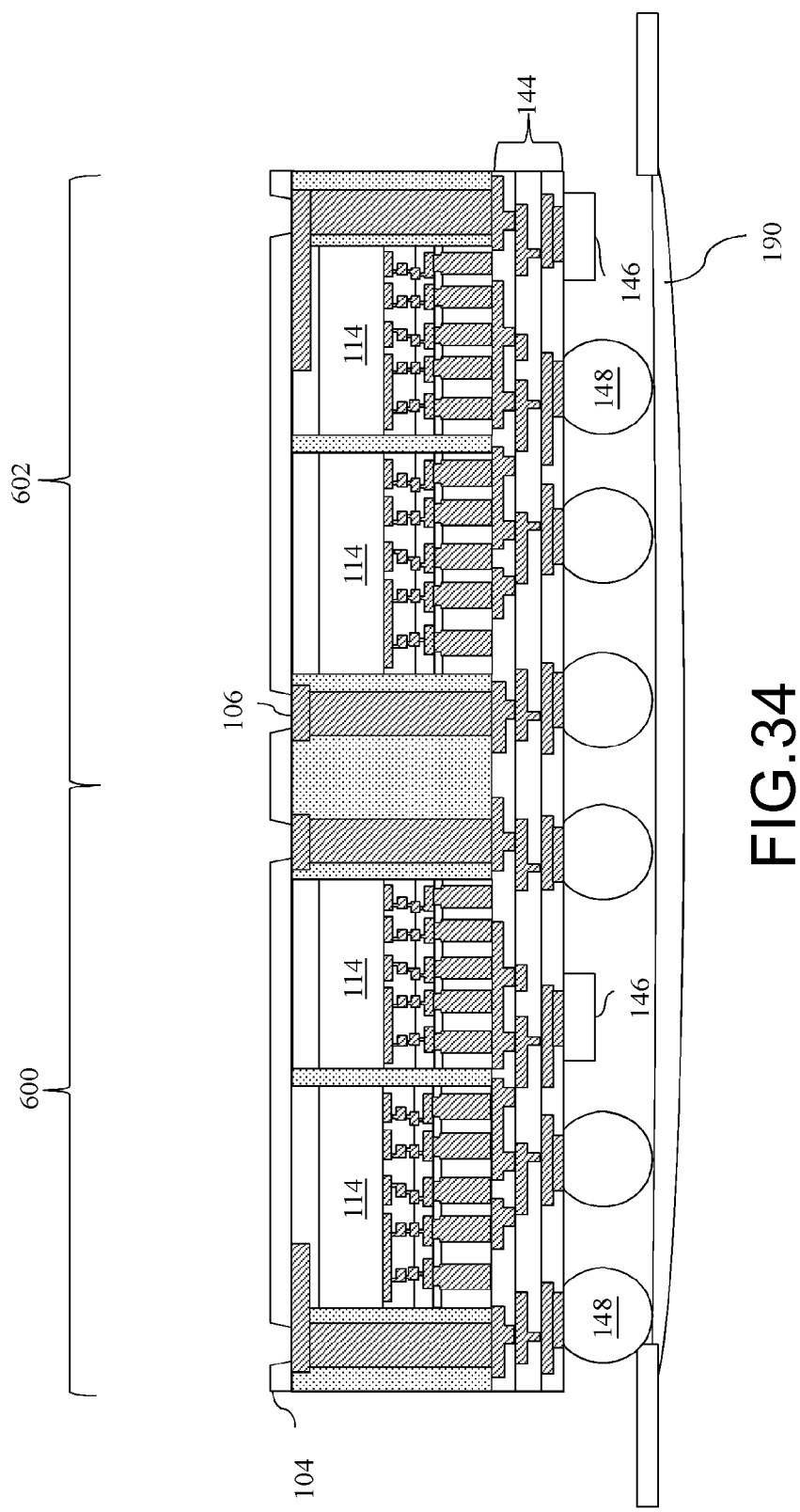

In FIG. 34, a carrier substrate de-bonding is performed to detach (de-bond) the carrier substrate 100 from the backside redistribution structure, e.g., dielectric layer 104. In accordance with some embodiments, the de-bonding includes projecting a light such as a laser light or an UV light on the release layer 102 so that the release layer 102 decomposes under the heat of the light and the carrier substrate 100 can be removed. The structure is then flipped over and placed on a tape 190.

As further illustrated in FIG. 34, openings are formed through the dielectric layer 104 to expose portions of the metallization pattern 106. The openings may be formed, for example, using laser drilling, etching, or the like.

Figure 35:
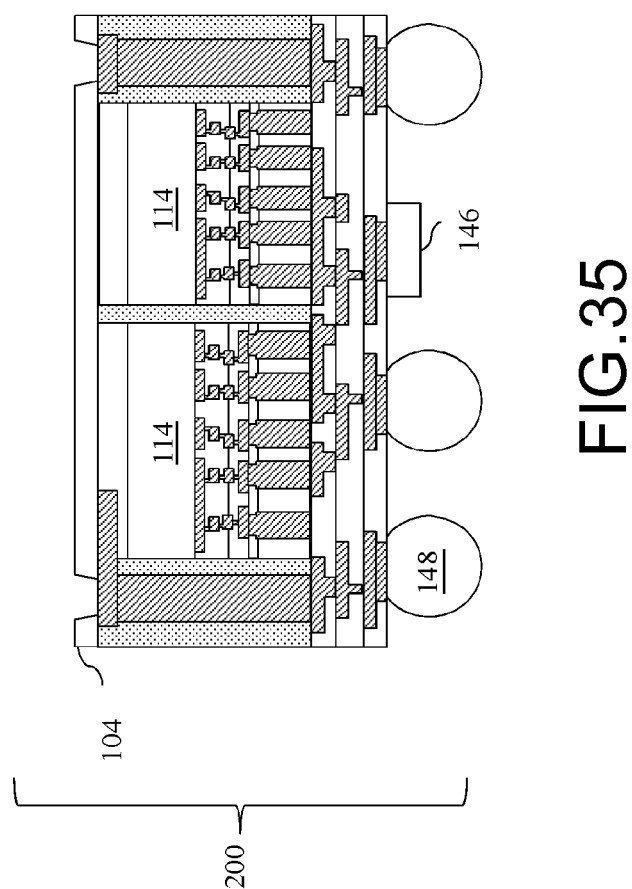

In FIG. 35, a singulation process is performed by sawing along scribe line regions e.g., between adjacent regions 600 and 602. The sawing singulates the first package region 600 from the second package region 602.

FIG. 35 illustrates a resulting, singulated package 200, which may be from one of the first package region 600 or the second package region 602. The package 200 may also be referred to as an integrated fan-out (InFO) package 200.

Figure 36:
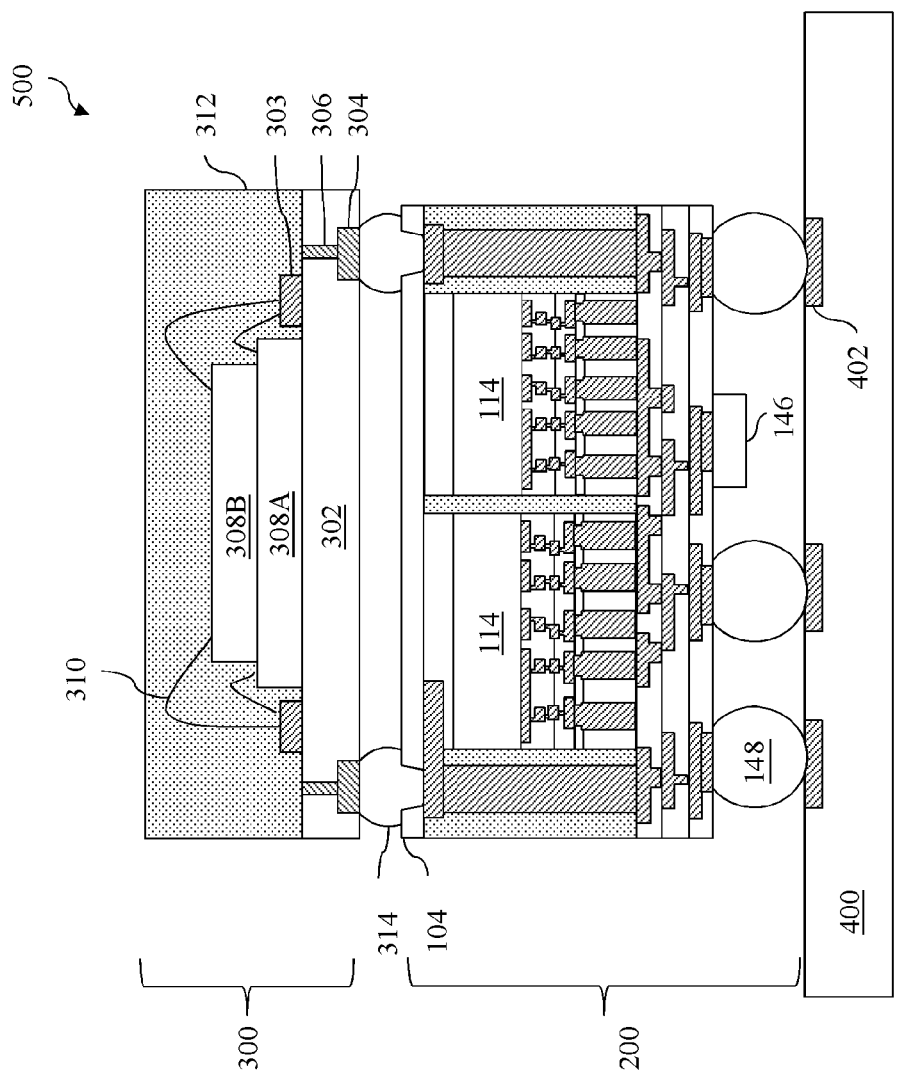

FIG. 36 illustrates a package structure 500 including the package 200 (may be referred to as a first package 200), a second package 300, and a substrate 400. The second package 300 includes a substrate 302 and one or more stacked dies 308 (308A and 308B) coupled to the substrate 302. The substrate 302 may be made of a semiconductor material such as silicon, germanium, diamond, or the like. In some embodiments, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate 302 may be a silicon-on-insulator (SOI) substrate. Generally, an SOI substrate includes a layer of a semiconductor material such as epitaxial silicon, germanium, silicon germanium, SOI, silicon germanium on insulator (SGOI), or combinations thereof. The substrate 302 is, in one alternative embodiment, based on an insulating core such as a fiberglass reinforced resin core. One example core material is fiberglass resin such as FR4. Alternatives for the core material include bismaleimide-triazine (BT) resin, or alternatively, other printed circuit board (PCB) materials or films. Build up films such as Ajinomoto build-up film (ABF) or other laminates may be used for substrate 302.

The substrate 302 may include active and passive devices (not shown in FIG. 28). As one of ordinary skill in the art will recognize, a wide variety of devices such as transistors, capacitors, resistors, combinations of these, and the like may be used to generate the structural and functional requirements of the design for the semiconductor package 300. The devices may be formed using any suitable methods.

The substrate 302 may also include metallization layers (not shown) and through vias 306. The metallization layers may be formed over the active and passive devices and are designed to connect the various devices to form functional circuitry. The metallization layers may be formed of alternating layers of dielectric (e.g., low-k dielectric material) and conductive material (e.g., copper) with vias interconnecting the layers of conductive material and may be formed through any suitable process (such as deposition, damascene, dual damascene, or the like). In some embodiments, the substrate 302 is substantially free of active and passive devices.

The substrate 302 may have bond pads 303 on a first side the substrate 302 to couple to the stacked dies 308, and bond pads 304 on a second side of the substrate 302, the second side being opposite the first side of the substrate 302, to couple to the conductive connectors 314. In some embodiments, the bond pads 303 and 304 are formed by forming recesses (not shown) into dielectric layers (not shown) on the first and second sides of the substrate 302. The recesses may be formed to allow the bond pads 303 and 304 to be embedded into the dielectric layers. In other embodiments, the recesses are omitted as the bond pads 303 and 304 may be formed on the dielectric layer. In some embodiments, the bond pads 303 and 304 include a thin seed layer (not shown) made of copper, titanium, nickel, gold, palladium, the like, or a combination thereof. The conductive material of the bond pads 303 and 304 may be deposited over the thin seed layer. The conductive material may be formed by an electrochemical plating process, an electroless plating process, CVD, ALD, PVD, the like, or a combination thereof. In an embodiment, the conductive material of the bond pads 303 and 304 is copper, tungsten, aluminum, silver, gold, the like, or a combination thereof.

In an embodiment, the bond pads 303 and 304 are UBMs that include three layers of conductive materials, such as a layer of titanium, a layer of copper, and a layer of nickel. However, one of ordinary skill in the art will recognize that there are many suitable arrangements of materials and layers, such as an arrangement of chrome/chrome-copper alloy/copper/gold, an arrangement of titanium/titanium tungsten/copper, or an arrangement of copper/nickel/gold, that are suitable for the formation of the UBMs 303 and 304. Any suitable materials or layers of material that may be used for the UBMs 303 and 304 are fully intended to be included within the scope of the current application. In some embodiments, the through vias 306 extend through the substrate 302 and couple at least one bond pad 303 to at least one bond pad 304.

In the illustrated embodiment, the stacked dies 308 are coupled to the substrate 302 by wire bonds 310, although other connections may be used, such as conductive bumps. In an embodiment, the stacked dies 308 are stacked memory dies. For example, the stacked memory dies 308 may include low-power (LP) double data rate (DDR) memory modules, such as LPDDR1, LPDDR2, LPDDR3, LPDDR4, non-volatile memory, or the like memory modules.

In some embodiments, the stacked dies 308 and the wire bonds 310 may be encapsulated by a molding material 312. The molding material 312 may be molded on the stacked dies 308 and the wire bonds 310, for example, using compression molding. In some embodiments, the molding material 312 is a molding compound, a polymer, an epoxy, silicon oxide filler material, the like, or a combination thereof. A curing step may be performed to cure the molding material 312, wherein the curing may be a thermal curing, a UV curing, the like, or a combination thereof.

In some embodiments, the stacked dies 308 and the wire bonds 310 are buried in the molding material 312, and after the curing of the molding material 312, a planarization step, such as a grinding, is performed to remove excess portions of the molding material 312 and provide a substantially planar surface for the second packages 300.

After the second packages 300 are formed, the packages 300 are bonded to the first packages 200 by way of conductive connectors 314, the bond pads 304, and the metallization pattern 106. In some embodiments, the stacked memory dies 308 may be coupled to the integrated circuit dies 114 through the wire bonds 310, the bond pads 303 and 304, through vias 306, the conductive connectors 314, and the through vias 112.

The conductive connectors 314 may be similar to the conductive connectors 148 described above and the description is not repeated herein, although the conductive connectors 314 and 148 need not be the same. In some embodiments, before bonding the conductive connectors 314, the conductive connectors 314 are coated with a flux (not shown), such as a no-clean flux. The conductive connectors 314 may be dipped in the flux or the flux may be jetted onto the conductive connectors 314. In another embodiment, the flux may be applied to the surfaces of the metallization patterns 106.

In some embodiments, the conductive connectors 314 may have an epoxy flux (not shown) formed thereon before they are reflowed with at least some of the epoxy portion of the epoxy flux remaining after the second package 300 is attached to the first package 200. This remaining epoxy portion may act as an underfill to reduce stress and protect the joints resulting from the reflowing the conductive connectors 314. In some embodiments, an underfill (not shown) may be formed between the second package 300 and the first package 200 and surrounding the conductive connectors 314. The underfill may be formed by a capillary flow process after the second package 300 is attached or may be formed by a suitable deposition method before the second package 300 is attached.

The bonding between the second package 300 and the first package 200 may be a solder bonding or a direct metal-to-metal (such as a copper-to-copper or tin-to-tin) bonding. In an embodiment, the second package 300 is bonded to the first package 200 by a reflow process. During this reflow process, the conductive connectors 314 are in contact with the bond pads 304 and the metallization patterns 106 to physically and electrically couple the second package 300 to the first package 200. After the bonding process, an IMC (not shown) may form at the interface of the metallization patterns 106 and the conductive connectors 314 and also at the interface between the conductive connectors 314 and the bond pads 304 (not shown).

The semiconductor package 500 includes the packages 200 and 300 being mounted to a substrate 400. The substrate 400 may be referred to a package substrate 400. The package 200 is mounted to the package substrate 400 using the conductive connectors 148.

The package substrate 400 may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the package substrate 400 may be a SOI substrate. Generally, an SOI substrate includes a layer of a semiconductor material such as epitaxial silicon, germanium, silicon germanium, SOI, SGOI, or combinations thereof. The package substrate 400 is, in one alternative embodiment, based on an insulating core such as a fiberglass reinforced resin core. One example core material is fiberglass resin such as FR4. Alternatives for the core material include bismaleimide-triazine BT resin, or alternatively, other PCB materials or films. Build up films such as ABF or other laminates may be used for package substrate 400.

The package substrate 400 may include active and passive devices (not shown in FIG. 36). As one of ordinary skill in the art will recognize, a wide variety of devices such as transistors, capacitors, resistors, combinations of these, and the like may be used to generate the structural and functional requirements of the design for the semiconductor package 500. The devices may be formed using any suitable methods.

The package substrate 400 may also include metallization layers and vias (not shown) and bond pads 402 over the metallization layers and vias. The metallization layers may be formed over the active and passive devices and are designed to connect the various devices to form functional circuitry. The metallization layers may be formed of alternating layers of dielectric (e.g., low-k dielectric material) and conductive material (e.g., copper) with vias interconnecting the layers of conductive material and may be formed through any suitable process (such as deposition, damascene, dual damascene, or the like). In some embodiments, the package substrate 400 is substantially free of active and passive devices.

In some embodiments, the conductive connectors 148 can be reflowed to attach the package 200 to the bond pads 402. The conductive connectors 148 electrically and/or physically couple the substrate 400, including metallization layers in the substrate 400, to the first package 200.

The conductive connectors 148 may have an epoxy flux (not shown) formed thereon before they are reflowed with at least some of the epoxy portion of the epoxy flux remaining after the package 200 is attached to the substrate 400. This remaining epoxy portion may act as an underfill to reduce stress and protect the joints resulting from the reflowing the conductive connectors 148. In some embodiments, an underfill (not shown) may be formed between the first package 200 and the substrate 400 and surrounding the conductive connectors 148. The underfill may be formed by a capillary flow process after the package 200 is attached or may be formed by a suitable deposition method before the package 200 is attached.

In the embodiments of FIGS. 1 through 36, a RDL last formation process is illustrated. For example, the redistribution structure 144 is formed over the integrated circuit dies 114 after the integrated circuit dies 114 are disposed in the first package 200. In other embodiments, the integrated circuit dies 114 may be bonded to package features after RDLs are formed (sometimes referred to as an RDL first process). For example, FIGS. 37 through 40 illustrate cross-sectional views of various intermediary stages of manufacturing a semiconductor package according to some alternative embodiments.

Figure 37:
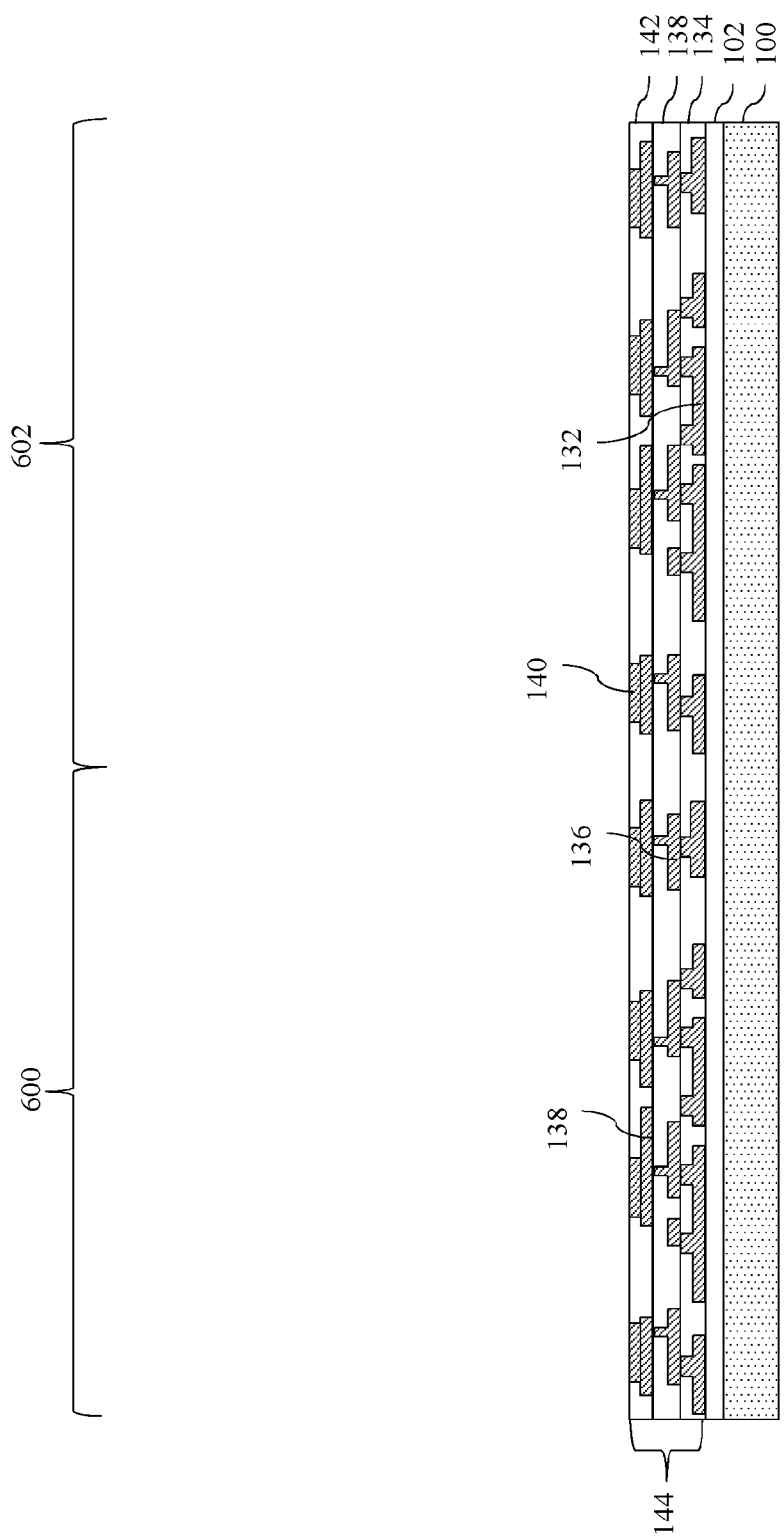
FIG. 37 through 40 illustrate various intermediary stages of forming a semiconductor device package in accordance with some other embodiments.

In FIG. 37, the redistribution structure 144 is formed over the carrier substrate 100 prior to attaching the integrated circuit dies 114. The processes used to form the redistribution structure 144 may be substantially similar to the processes described in FIGS. 1 through 36 where like reference numerals indicate like elements.

Figure 38:
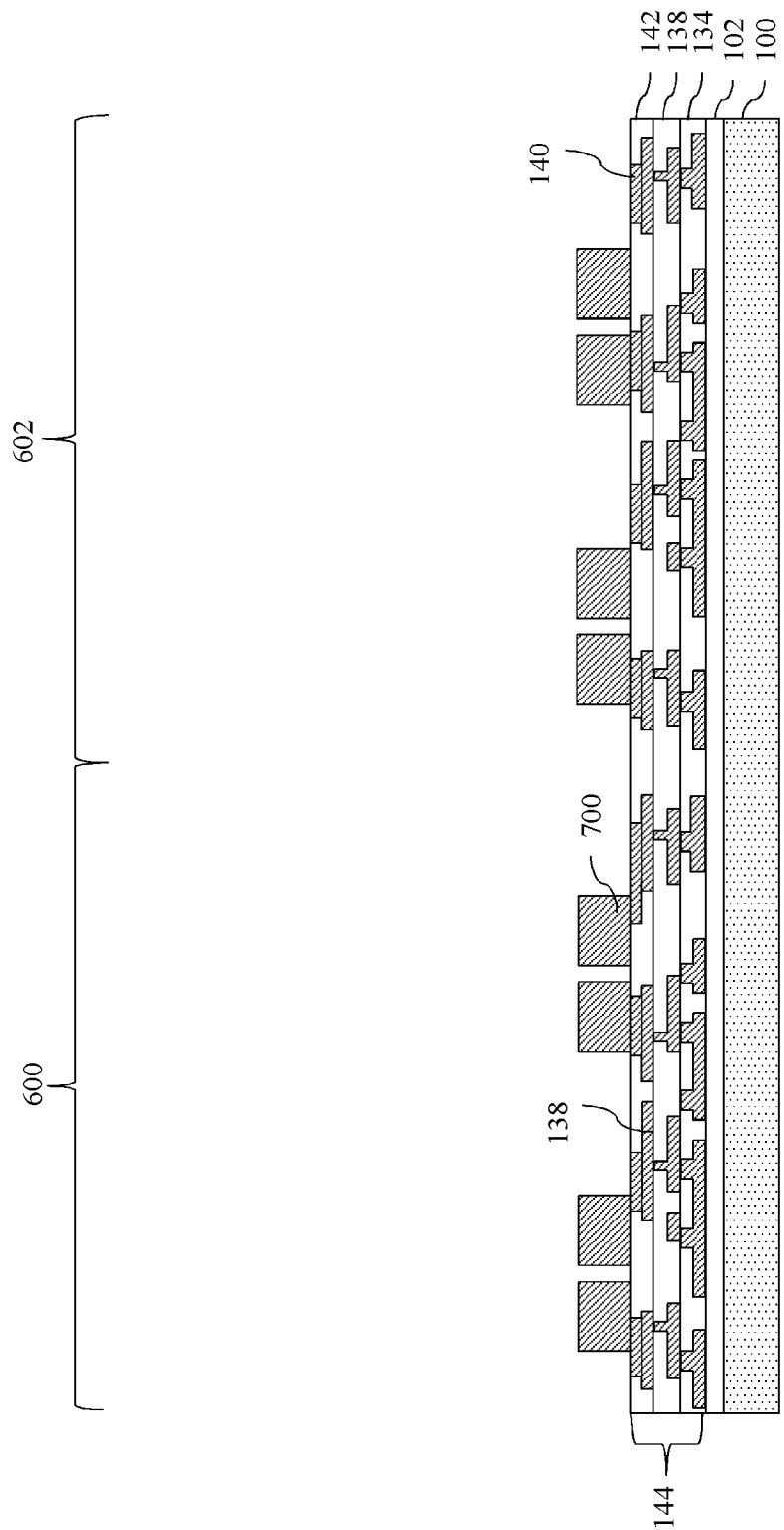

After the redistribution structure 144 is formed, conductive pillars 700 are formed on the redistribution structure 144 as illustrated by FIG. 38. As an example to form conductive pillars 700, a seed layer (not shown) is formed over the redistribution structure 144. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is then formed and patterned on the seed layer. The photo resist may be formed by spin coating or the like and may be exposed to light for patterning. The pattern of the photo resist corresponds to the conductive pillars 700. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the conductive pillars 700.

Figure 39:
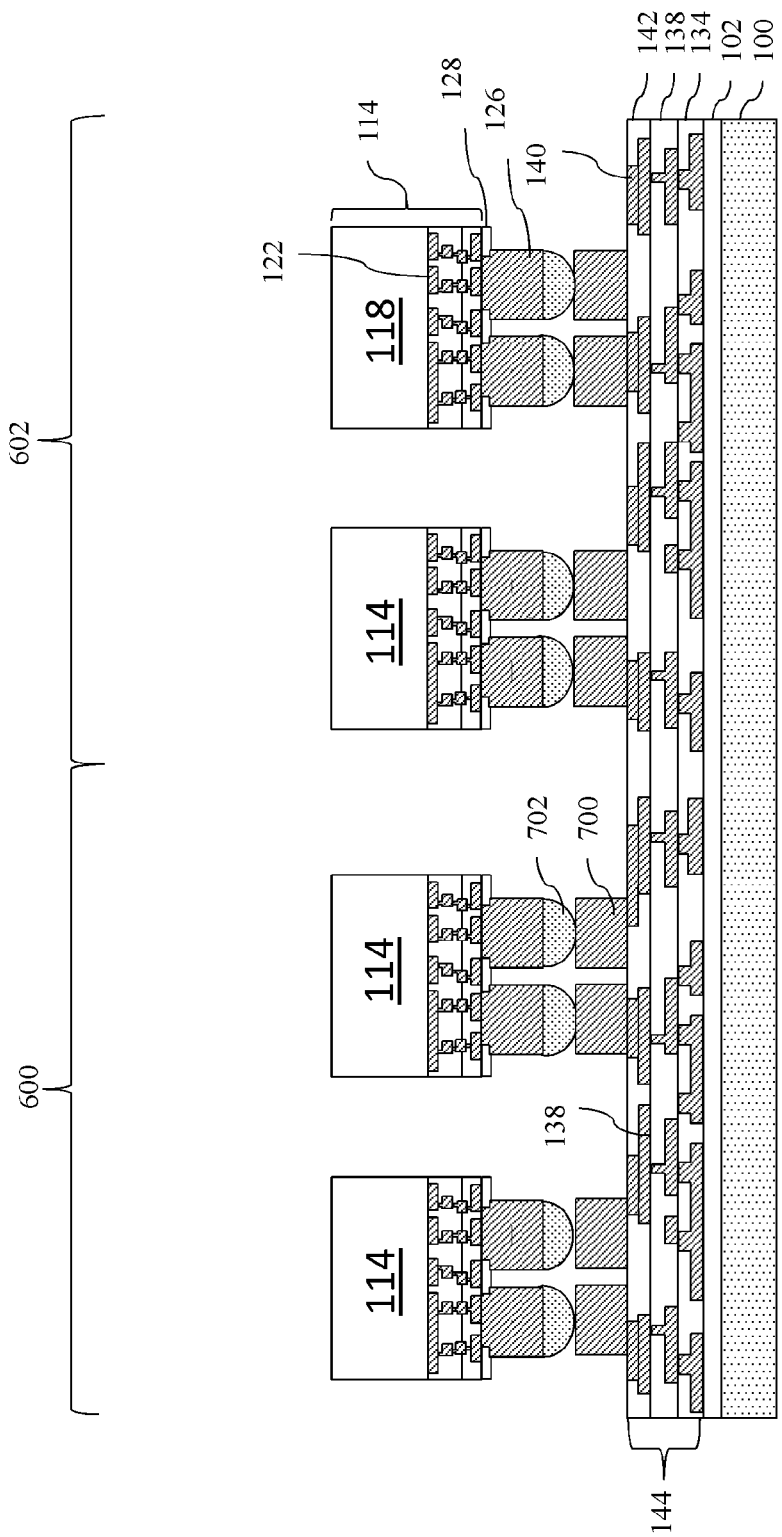

In FIG. 39, the integrated circuit dies 114 are bonded to the redistribution structure 144 using a suitable bonding process, such as flip chip bonding. The integrated circuit dies 114 may be bonded to the conductive pillars 700 using conductive connectors 702. The conductive connectors 702 may comprise microbumps (μbumps), C4 bumps, BGA balls, or the like. The integrated circuit dies 114 may include similar features as described above with respect to the integrated circuit dies 114 of FIG. 4 where like reference numerals indicate like elements.

Figure 40:
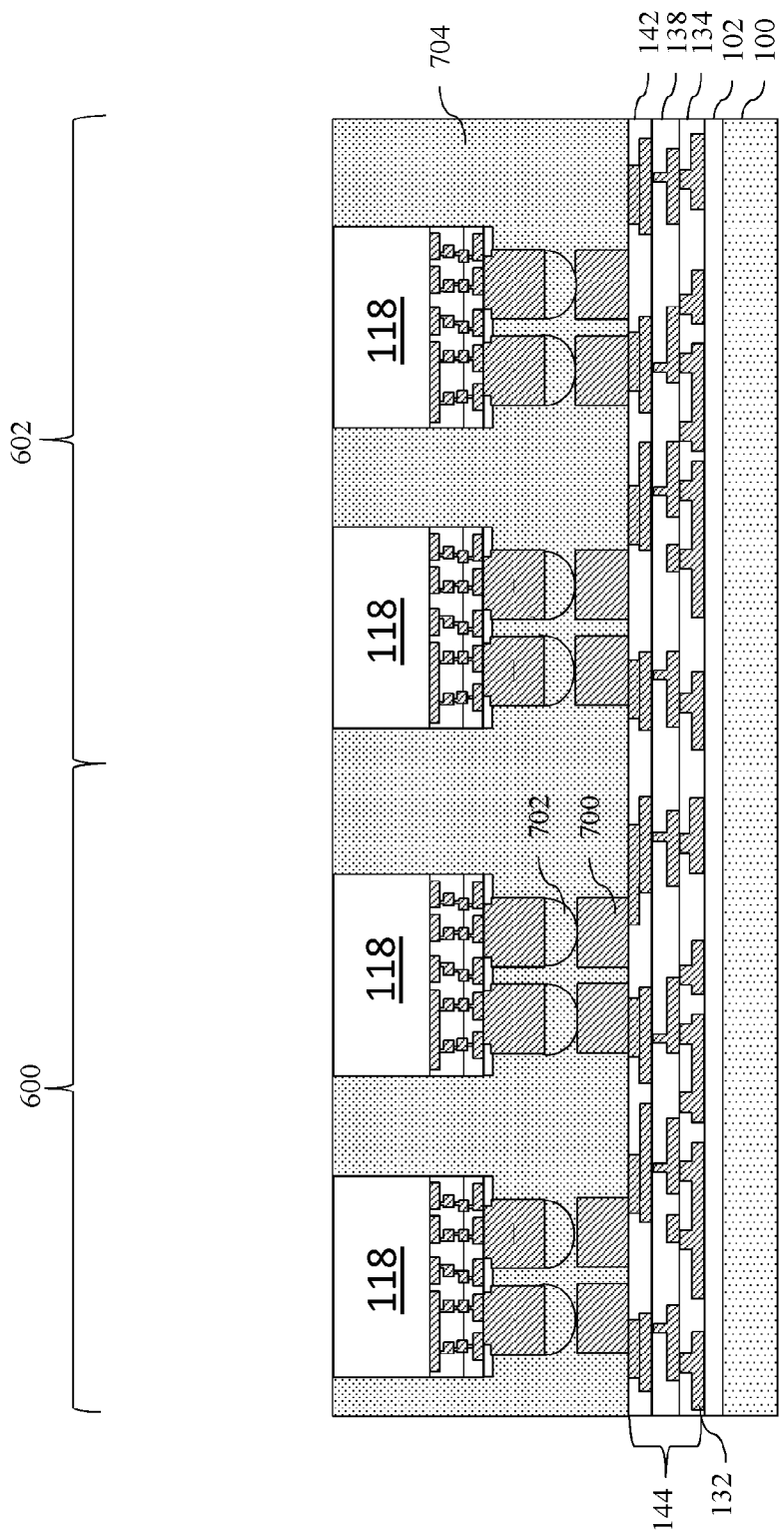

Subsequently, in FIG. 40, an encapsulant 704 is formed on the various components. The encapsulant 704 may be a molding compound, epoxy, or the like, and may be applied by compression molding, transfer molding, or the like. The encapsulant 704 may be dispensed around the integrated circuit 114 and between the integrated circuit die 114 and the redistribution structure 144. After curing, the encapsulant 704 can optionally undergo a grinding process to expose the integrated circuit dies 114. In some embodiments, the grinding may be omitted. After the encapsulant 704 is formed, various features may be debonded from the carrier 100, and a singulation process may be applied along scribe lines (e.g., disposed between adjacent package regions 600 and 602). Conductive connectors (not shown) may be formed on an opposing side of the redistribution structure 144 (e.g., on the metallization pattern 132). The conductive connectors may be used to bond the singulated package to other package features, such as other integrated circuit dies, device packages, package substrates, interposers, motherboards, combinations thereof, or the like.

Thus, as described above, various embodiments provide methods of forming conductive features, such as conductive lines and/or vias, in redistribution structures of a semiconductor package. Embodiment processes may form conductive vias using a photo resist to define a pattern of the conductive vias. Because the photo resist is subsequently removed after the conductive vias are formed, the selection of a material for the photo resist is not limited to dielectric materials suitable for inclusion in a finished packet. For example, the material of the photo resist may be selected to support relatively high resolution lithography, which allows for fine-pitched conductive vias to be formed. An embodiment conductive via may have a width of about 1 µm or less although vias of other dimensions may also be formed. After the photo resist is removed, a dielectric layer is formed around the vias, and the dielectric layer's material is selected to provide structural support and insulation to a redistribution pattern disposed therein. Although the dielectric layer may also comprise a photosensitive material, the dielectric layer may not support as high a resolution patterning as the photo resist used to define the conductive vias. Therefore, various embodiments may provide one or more of the following non-limiting advantages: smaller conductive vias by using a higher resolution photoresist to define a shape of the conductive vias; lower manufacturing cost; reduced polymer layer resolution window issues; improved planarity in redistribution layers; increased metallization pattern density; and the like.

In accordance with an embodiment, a method includes forming a patterned first photo resist over a seed layer. A first opening in the patterned first photo resist exposes the seed layer. The method further includes plating a first conductive material in the first opening on the seed layer, removing the patterned first photo resist, and after removing the patterned first photo resist, forming a patterned second photo resist over and along sidewalls of the first conductive material. A second opening in the patterned second photo resist exposes a portion of the first conductive material. The method further includes plating a second conductive material in the second opening on the first conductive material, removing the patterned second photo resist, and after removing the patterned second photo resist, removing exposed portions of the seed layer. The method further includes depositing a dielectric layer around the first conductive material and the second conductive material.

In accordance with another embodiment, a method includes encapsulating an integrated circuit die in an encapsulant, depositing a first photo resist over the encapsulant and the integrated circuit die, patterning a first opening in the first photo resist to expose a first conductive material, and plating a conductive via in the first opening. The conductive via is electrically connected to the integrated circuit die. The method further includes removing the first photo resist and depositing a first polymer layer around the conductive via. The first polymer layer and the first photo resist comprise different materials. The first photo resist supports higher resolution lithography than the first polymer layer. The method further includes planarizing the first polymer layer so that top surface of the first polymer layer and the conductive via are substantially level.

In accordance with yet another embodiment, a semiconductor package includes an integrated circuit die, an encapsulant disposed around the integrated circuit die, a through via extending through the encapsulant, and a redistribution structure over the integrated circuit die and the encapsulant. A metallization pattern of the redistribution structure includes a conductive line disposed in a dielectric layer and electrically connected to the integrated circuit die. The dielectric layer contacts a top surface of the encapsulant. The metallization pattern further includes a conductive via over and electrically connected to the conductive line. A top surface of the conductive via is substantially level with a top surface of the dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a patterned first photo resist over a seed layer, wherein a first opening in the patterned first photo resist exposes the seed layer;
   plating a first conductive material in the first opening on the seed layer;
   removing the patterned first photo resist;
   after removing the patterned first photo resist, forming a patterned second photo resist over and along sidewalls of the first conductive material, wherein a second opening in the patterned second photo resist exposes a portion of an upper surface and a sidewall of the first conductive material, wherein the second opening does not expose the seed layer in a cross-sectional view;
   plating a second conductive material in the second opening on the first conductive material;
   removing the patterned second photo resist;
   after removing the patterned second photo resist, removing exposed portions of the seed layer; and
   depositing a dielectric layer around the first conductive material and the second conductive material.

2. The method of claim 1 further comprising planarizing the dielectric layer so that a top surface of the dielectric layer is substantially level with a top surface of the second conductive material.

3. The method of claim 1, wherein a photosensitive material of the patterned second photo resist is disposed between a bottom surface of the second conductive material and the seed layer.

4. The method of claim 1 further comprising depositing the seed layer over an integrated circuit die and on an encapsulant encapsulating the integrated circuit die.

5. The method of claim 1 further comprising:
   depositing the seed layer over a carrier substrate; and
   after depositing the dielectric layer, bonding an integrated circuit die over the dielectric layer using a flip chip bonding process.

6. The method of claim 5 further comprising encapsulating the integrated circuit die, wherein encapsulating the integrated circuit die comprises dispensing an encapsulant between a bottom surface of the integrated circuit die and the dielectric layer.

7. The method of claim 1, wherein the dielectric layer comprises a photosensitive polymer, and wherein the patterned second photo resist supports a higher resolution lithography process than the photosensitive polymer.

8. The method of claim 1, wherein the dielectric layer comprises an oxide.

9. The method of claim 1, wherein the dielectric layer contacts a sidewall of the first conductive material directly below the second conductive material.

10. A method comprising:
encapsulating an integrated circuit die in an encapsulant;
depositing a first photo resist over the encapsulant and the integrated circuit die;
patterning a first opening in the first photo resist to expose a first conductive material;
plating a conductive via in the first opening, wherein the conductive via is electrically connected to the integrated circuit die, wherein a bottom surface of the conductive via contacts the first photo resist;
removing the first photo resist;
after removing the first photo resist, depositing a first polymer layer around the conductive via, wherein the first polymer layer and the first photo resist comprise different materials, wherein depositing the first polymer layer comprises depositing a portion of the first polymer layer directly under the bottom surface of the conductive via; and
planarizing the first polymer layer so that a top surface of the first polymer layer and a top surface of the conductive via are substantially level.

11. The method of claim 10, wherein the first conductive material is a conductive line, wherein depositing the first polymer layer further comprises depositing the first polymer layer along sidewalls of the conductive line.

12. The method of claim 11 further comprising:
depositing a second photo resist over the integrated circuit die and the encapsulant;
patterning a second opening in the second photo resist;
plating the conductive line in the second opening, wherein the conductive line is electrically connected to the integrated circuit die; and
removing the second photo resist, wherein the first photo resist is deposited after the second photo resist is removed.

13. The method of claim 10, wherein the first polymer layer contacts a sidewall of the first conductive material directly below the conductive via.

14. The method of claim 10, wherein the first opening exposes a top surface and a sidewall of the first conductive material, wherein the first opening does not extend to a bottom of the first conductive material.

15. A method comprising:
encapsulating an integrated circuit die in an encapsulant;
depositing a first mask over the encapsulant and the integrated circuit die, wherein the first mask is a single material layer;
patterning a first opening in the first mask to expose a first conductive element;
forming a conductive via in the first opening, wherein the conductive via is electrically connected to the integrated circuit die, wherein a bottom surface of the conductive via is over the first mask;
removing the first mask, wherein after removing the first mask, a top surface, the bottom surface, a first sidewall surface extending between the top surface and the bottom surface, and a second sidewall surface extending between the top surface and the bottom surface of the conductive via are at least partially exposed;
depositing a first insulating layer around the conductive via, wherein the first insulating layer and the first mask comprise different layers; and
planarizing the first insulating layer to expose an upper surface of the conductive via.

16. The method of claim 15, wherein the first mask comprises a photo resist layer.

17. The method of claim 15, wherein the first insulating layer comprises a polymer.

18. The method of claim 15, wherein patterning the first opening comprises exposing a sidewall of the first conductive element.

19. The method of claim 15, wherein the first insulating layer comprises an oxide.

20. The method of claim 15, wherein the first insulating layer contacts a surface of the first conductive element directly below the conductive via.

* * * * *